US006391707B1

(12) United States Patent
Dirnecker et al.

(10) Patent No.: US 6,391,707 B1
(45) Date of Patent: May 21, 2002

(54) METHOD OF MANUFACTURING A ZERO MASK HIGH DENSITY METAL/INSULATOR/ METAL CAPACITOR

(75) Inventors: Christoph Dirnecker, Ergolding; Jeffrey A. Babcock, Neufahrn; Michael Schober, Freising; Scott G. Balster, Munich; Angelo Pinto, Buch am Erlbach, all of (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/849,299

(22) Filed: May 4, 2001

(51) Int. Cl.[7] .......................................... H01L 21/8242
(52) U.S. Cl. ....................................... 438/250; 257/532
(58) Field of Search ................................ 438/386, 396, 438/148, 250, 229, 637, 253, 254, 240, 238, 381, 639, 393; 257/296, 310, 532, 301, 529, 534, 295, 306, 311

(56) References Cited

U.S. PATENT DOCUMENTS

| | | |
|---|---|---|
| 6,057,571 A | 5/2000 | Miller et al. |
| 6,150,206 A | 11/2000 | Oh |
| 6,281,541 B1 * | 8/2001 | Hu ............................. 257/306 |
| 6,320,244 B1 * | 11/2001 | Alers et al. ................ 257/534 |

* cited by examiner

*Primary Examiner*—David Nelms
*Assistant Examiner*—David Vu
(74) *Attorney, Agent, or Firm*—Jacqueline J. Garner; W. James Brady, III; Frederick J. Telecky, Jr.

(57) ABSTRACT

The present invention is directed to a structure and method of forming an integrated circuit MIM capacitor having a relatively capacitance without the need for an additional mask step. Methods of forming integrated circuit capacitors include the steps of forming a standard via and one or more enlarged vias in an electrically insulating layer during the same patterning process and then forming an electrically conductive first electrode layer which fills the standard via and overlays the enlarged vias in a conformal manner. A dielectric layer is then formed over the electrically conductive first electrode layer. Next, an electrically conductive second electrode layer is formed over the dielectric layer, which overlays and/or fills the enlarged vias. A step is then performed to planarize the second electrode layer, the dielectric layer, and the first electrode layer to define the electrodes of a capacitor. The resulting capacitor has a relatively large effective electrode surface area (which is a function of the depth of the via) for a given lateral dimension.

68 Claims, 23 Drawing Sheets

FIG. 27 (VIEW A - A)

METHOD OF MANUFACTURING A ZERO MASK HIGH DENSITY METAL/INSULATOR/ METAL CAPACITOR

TECHNICAL FIELD OF INVENTION

The present invention relates generally to a structure and method of forming integrated circuits (ICs) having multiple layers of metal interconnects. More particularly, the present invention relates to a method of forming a metal-insulator-metal (MIM) capacitor for such ICs which requires no additional mask operations during formation, and wherein the capacitor has a relatively large value of capacitance relative to the planar surface area it consumes, and linear signal response characteristics.

BACKGROUND OF THE INVENTION

In semiconductor manufacturing, capacitors are commonly employed in digital and memory ICs for a variety of purposes. Such purposes include storing electrical charge, blocking DC voltage levels, and stabilizing power supplies. Typical capacitors used in semiconductor devices may have the structure of a metal oxide semiconductor (MOS) type, P-N junction type, polysilicon-insulator-polysilicon (PIP) type, metal-insulator-metal (MIM) type, etc. The type of capacitor utilized in the semiconductor device typically depends on the application and desired response characteristics of the IC.

In memory ICs, for example, dynamic random access memories (DRAMs), a capacitor is used to hold enough charge to represent a detectable logic state. Polysilicon is typically used to construct the plates of the capacitor, thus forming a PIP capacitor. Polysilicon is not necessarily the optimum material to form the capacitor plates because its doping characteristics result in variable capacitance in the polysilicon plate-polysilicon plate capacitor. In polysilicon capacitors, the value of capacitance varies relative to the voltage level applied to the capacitor. The resistance of the polysilicon tends to be dependent on, and therefore a function of, the level of voltage applied to the polysilicon. Polysilicon capacitors are also frequently located in positions in the IC where the surrounding IC components degrade the performance of the capacitor. For example, locating the capacitor on the substrate increases the parasitic effect on the capacitor, further degrading its performance.

Despite these effects, the variance in capacitance is not of primary concern in memory ICs because the capacitor is required to accept charge, to hold some or all of the charge for a period of time, and then discharge; all in a reliable manner. Furthermore, since polysilicon is also used to fabricate other components of the IC, such as transistors and conductors, the plates of the capacitors can be formed simultaneously with the other components of the IC, thus simplifying the construction process and reducing fabrication costs.

In analog circuit applications, on the other hand, capacitors are frequently used as impedance elements whose response characteristic must be generally linear. If the impedance of the capacitor is not fixed and reliably ascertainable, the response of the capacitor will vary non-linearly. As a result, the performance of the analog circuit may be unsatisfactory.

The development of system level integrated circuits (SLICs) and application specific integrated circuits (ASICs) have combined linear or analog circuitry and digital circuitry on the same IC. In such applications, linear capacitors have become somewhat problematic. Polysilicon is not a desirable material from which to form linear capacitors because of its non-linear response characteristics. The fabrication technology for memory capacitors is not generally applicable for fabricating capacitors that may be required to serve as both digital components and analog components.

Capacitors also affect the cost of the IC. In general, the cost of the IC is directly related to the size or surface area of the substrate upon which the IC is constructed. If the IC components require a large amount of space, a larger substrate is required, and the IC cost increases.

The ongoing evolution of miniaturizing ICs has resulted in reduced costs and more circuit functionality for a given substrate size and manufacturing cost. For example, only a few years ago, spacing between adjoining circuit elements in a typical IC was in the neighborhood of two to three microns. Today, many ICs are being designed at spacing distances as small as 0.35 microns or less. To accommodate narrower spacing, the electrical conductors are reduced in width. Metal conductors have also been substituted for polysilicon conductors because the metal conductors provide better signal conducting capabilities. The substitution of metal conductors for polysilicon conductors consequently forms a MIM structure capacitor.

Decreasing the size of devices such as, for example, a MIM capacitor is possible, in part, as a result of advanced planarization techniques such as chemical mechanical polishing (CMP). CMP smooths relatively significant variations in the height of the different components to a planar surface. Smoothing the variable-height topography to a planar surface allows typical lithographic semiconductor fabrication techniques to be used to form considerably more layers than were previously possible in IC construction. Previously, only one or two layers were typically constructed before the topography variations created such significant depth of focus problems with lithographic processes that any further precision fabrication of layered elements was prevented. However, with the introduction of CMP, the number of layers of the IC is no longer limited by the topography. Some present ICs are formed by as many as five or more separate metal or interconnect layers, each of which is separated by a CMP planarized dielectric layer. Consequently, CMP has created the opportunity to incorporate more circuitry on a single substrate in a single IC.

The process of manufacturing thin film MIM capacitors typically uses a multilayer-wiring process incorporating CMP to achieve high integration levels in the IC. More specifically, the customary method of manufacturing MIM capacitors requires an additional lithographic mask level in the production process along with CMP in order define the capacitor region and to isolate the capacitor from other components due to the structure of the capacitor. The structure of a high-capacitance MIM capacitor typically comprises one or more trenches, whereby electrodes of the capacitor follow the topography of the trenches, thus increasing the relative surface area of the electrodes, and thereby increasing the capacitance of the capacitor. Increasing the relative surface area of the capacitor electrodes while maintaining a relatively small footprint of the capacitor on the substrate is essential to attaining smaller and smaller ICs. The addition of a mask level in the customary IC production process adds both cost and time to the manufacturing process. Consequently, a need exists in the industry for a method of manufacturing a MIM capacitor without requiring an additional mask step.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention relates generally to a structure and method of fabrication of an IC capacitor with a MIM structure without requiring an additional lithographic mask operation.

Customary methods of manufacturing MIM capacitors require an additional mask operation in the IC production process flow to define a capacitor region and to separate it from pure interconnect structures. The present invention is directed to a method of manufacturing a MIM capacitor utilizing standard IC production processes without an additional lithographic mask operation by forming enlarged vias and standard vias during a step where only standard vias are ordinarily formed, and by utilizing advanced planarization techniques such as chemical mechanical polishing (CMP), thereby defining isolated capacitor regions. Elimination of additional masking operations allows for more economical and efficient manufacturing of capacitors.

Additionally, the present invention is directed to a structure and method of manufacturing high-capacitance MIM capacitors wherein MIM capacitor electrode surface areas are large relative to the surface area of the substrate upon which the capacitor is constructed. In one exemplary aspect of the present invention, capacitor electrode surface area is increased by forming one or more enlarged deep vias, wherein the enlarged deep vias are formed over a previously-formed conductive layer without an additional mask operation. In another exemplary aspect of the present invention, capacitor electrode surface area is increased by using a previously-patterned conductive layer as a mask for forming one or more enlarged deep vias without an additional mask operation. Another exemplary aspect of the present invention is a method of forming a capacitor structure with a very large capacitor electrode surface area and a means to electrically connect the capacitor to other components without an additional mask operation. Yet another exemplary aspect of the present invention is a method of forming a stacked capacitor with large capacitor electrode surface areas without an additional mask operation.

To the accomplishment of the foregoing and related ends, the invention comprises the features hereinafter filly described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
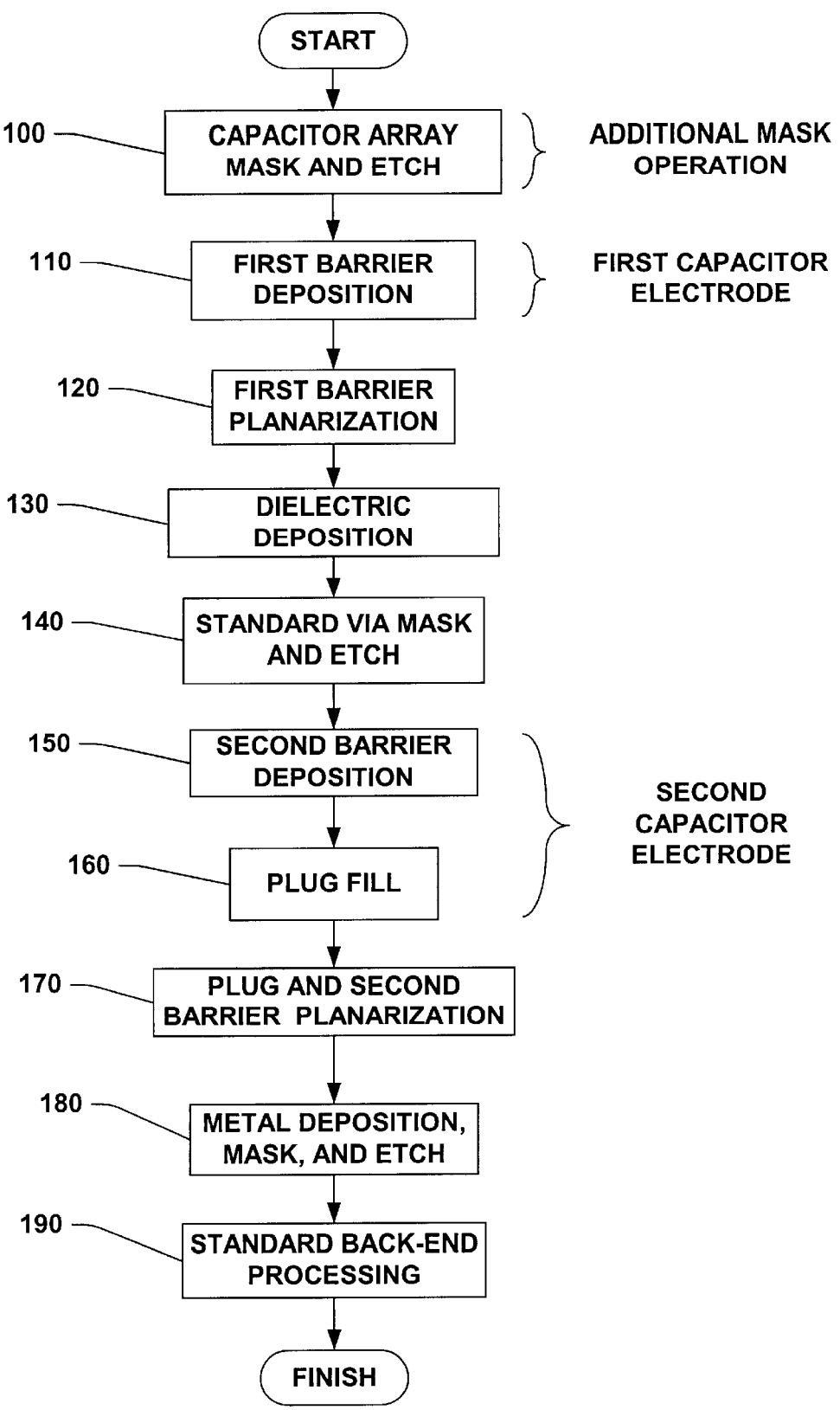
FIG. 1 is a flow chart diagram illustrating a method of fabricating an extended surface area Metal-Insulator-Metal capacitor according to the prior art.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

The present invention is directed toward a structure and method of manufacturing a metal-insulator-metal (MIM) capacitor structure. More particularly, the capacitor structure is manufactured using standard integrated circuit production processes and requires no additional lithographic mask steps during formation. By requiring no additional mask steps during formation, the capacitor can be formed in a more cost effective and time efficient manner over methods of the prior art.

In order to properly understand the various advantageous inventive aspects of the present invention, a brief description of a conventional methodology of forming a MIM capacitor in the prior art will be described. A flow chart diagram for forming a MIM capacitor using the conventional methodology in the prior art is illustrated FIG. 1. The methodology of FIG. 1 is further illustrated in FIGS. 2–10 of the prior art by cross sectional diagrams.

Figure 2:
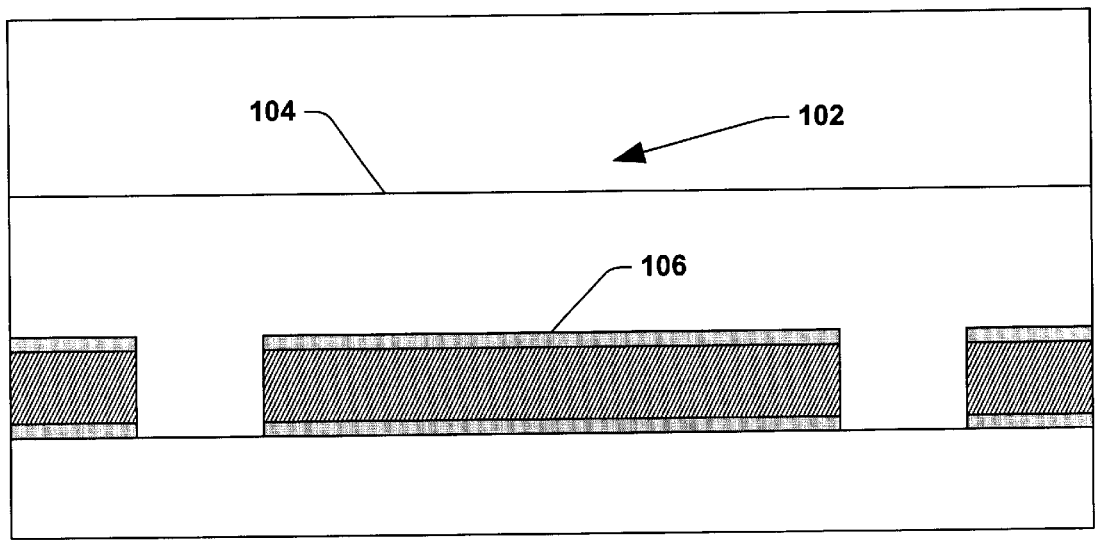
FIG. 2 is a fragmentary cross section diagram illustrating a structural foundation for forming a capacitor according to the prior art.
Figure 3:
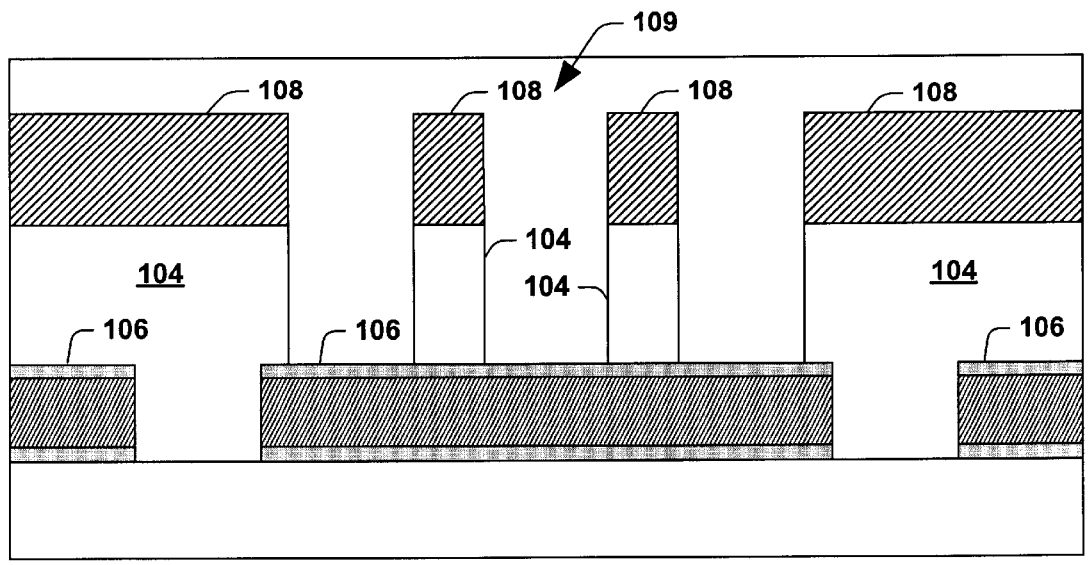
FIG. 3 is a fragmentary cross section diagram illustrating a step of forming a first photoresist mask over a first insulating layer and selectively etching the first insulating layer using a first metal layer as an etch stop, thereby defining a capacitor array according to the prior art.

In the conventional methodology of forming a MIM capacitor, a surface 102 upon which the capacitor is to be formed is illustrated in FIG. 2, wherein a first insulating layer 104 has been formed over a first metal layer 106 (e.g., first wiring layer). Referring to FIG. 3, a capacitor array 109 is defined by a capacitor array photoresist mask 108 during the capacitor array photoresist mask and etch operation at step 100 of FIG. 1. The capacitor array photoresist mask 108 is formed on the first insulating layer 104, wherein the mask 108 is used to selectively etch the first insulating layer 104, and whereby the first metal layer 106 serves as an etch stop to define a capacitor array 109. The capacitor array photoresist mask and etch at step 100 is performed exclusively for the formation of the capacitor array 109. Step 100, therefore, is an additional step to the standard IC production process and requires an additional photoresist mask 108 to define the capacitor array 109.

Figure 4:
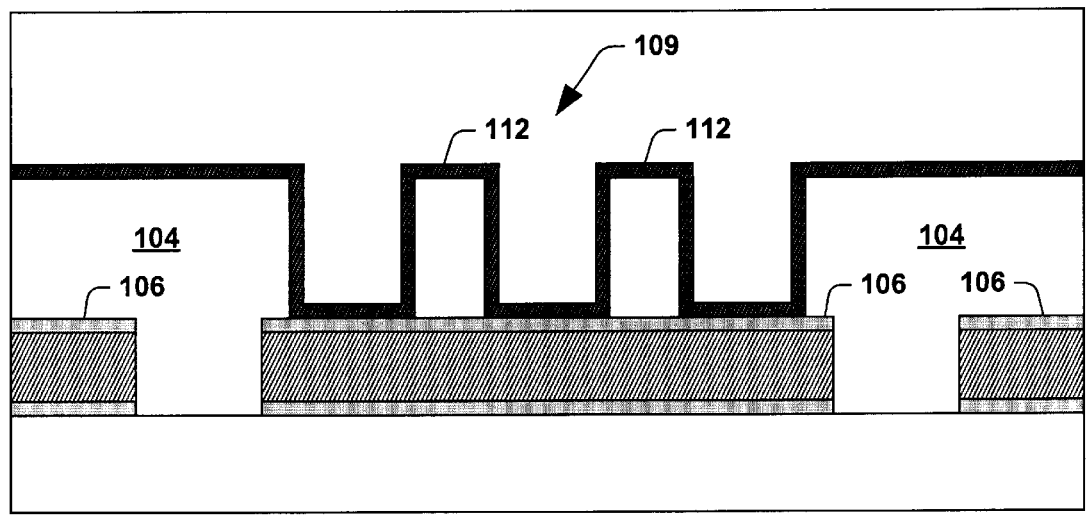
FIG. 4 is a fragmentary cross section diagram illustrating a step of forming a first barrier metal layer over the first insulating layer according to the prior art.
Figure 5:
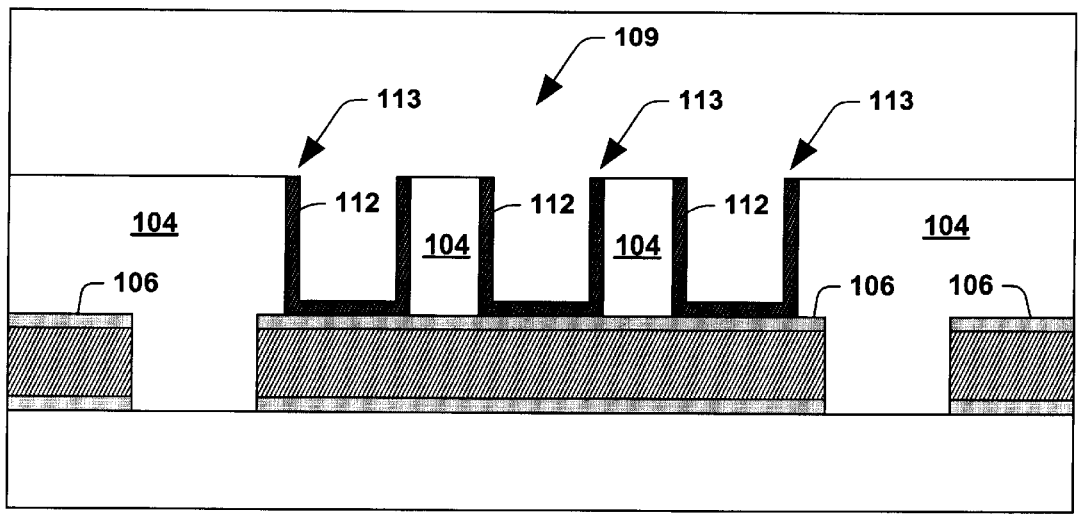
FIG. 5 is a fragmentary cross section diagram illustrating a step of planarizing the first barrier metal layer according to the prior art.
Figure 6:
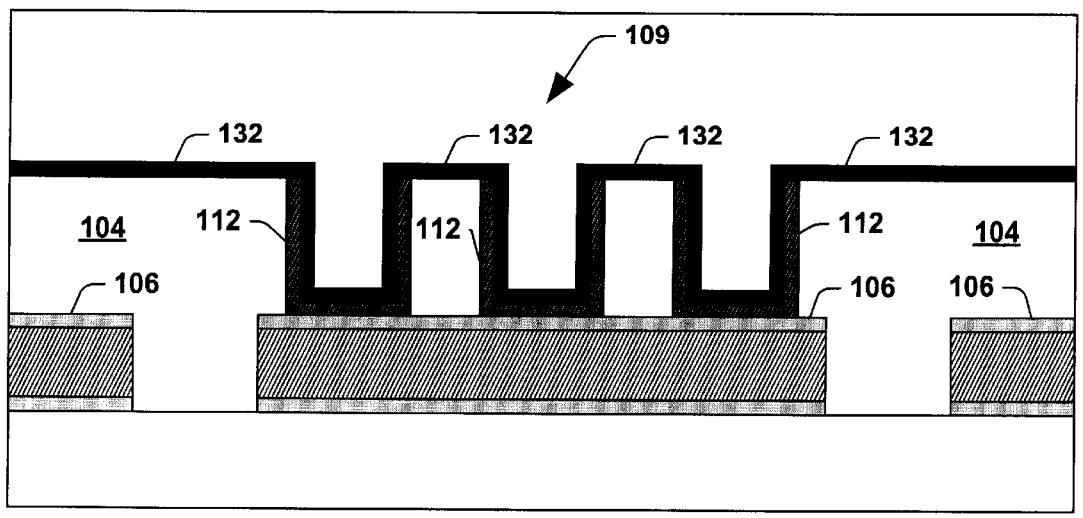
FIG. 6 is a fragmentary cross section diagram illustrating a step of forming a dielectric layer over the first barrier metal layer according to the prior art.

After the capacitor array photoresist mask and etch is performed at step 100, a first barrier metal layer 112 is deposited at step 110, wherein the first barrier metal layer 112 is formed over the first insulating layer 104 and the first metal layer 106 in a generally conformal manner, as illustrated in FIG. 4. The first barrier metal 112 is then planarized at step 120, thus defining a first electrode 113 of the capacitor array 109 as illustrated in FIG. 5. The planarization at step 120 uses, for example, chemical-mechanical polishing (CMP) techniques to planarize the first barrier metal 112 down to the first insulating layer 104 to electrically isolate the capacitor array 109 from other components. A subsequent dielectric deposition is performed at step 130, as illustrated in FIG. 6, wherein a dielectric layer 132 is formed over the planarized first barrier metal layer 112 and the first insulating layer 104 in a generally conformal manner.

Figure 7:
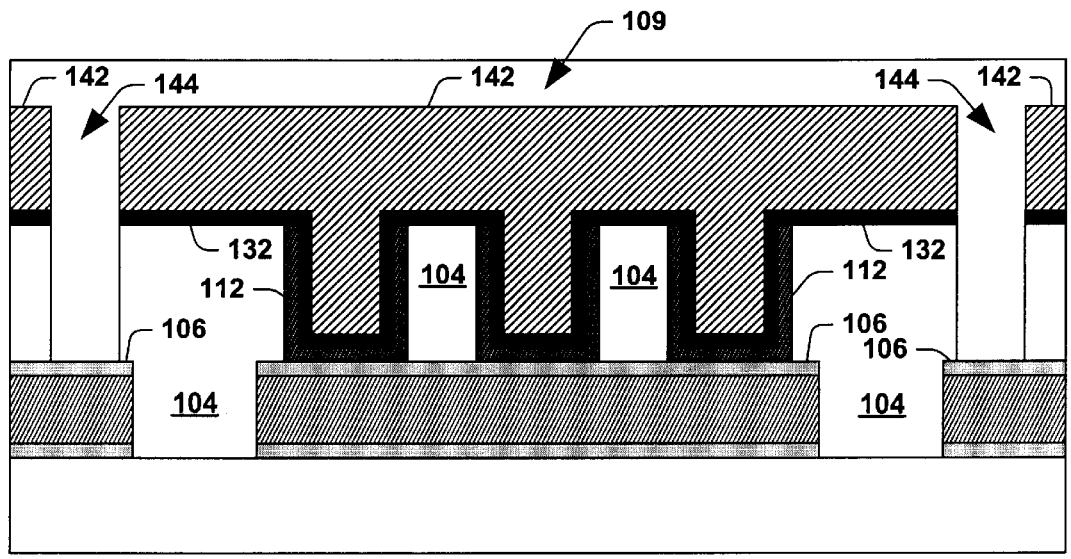
FIG. 7 is a fragmentary cross section diagram illustrating a step of forming a second photoresist mask over the dielectric layer and selectively etching the dielectric layer and the first insulating layer using the first metal layer as an etch stop, thereby defining standard vias according to the prior art.

The next step in the method of the prior art as detailed in FIG. 1 comprises a standard via photoresist mask and etch operation at step 140, which is a typical operation in an IC production process. As illustrated in FIG. 7, a standard via photoresist mask 142 is formed over the dielectric layer 132, and an etch process is performed whereby the dielectric layer 132 and the first insulating layer 104 are selectively etched using the first metal layer 106 as an etch stop, thereby defining one or more standard vias 144.

Figure 8:
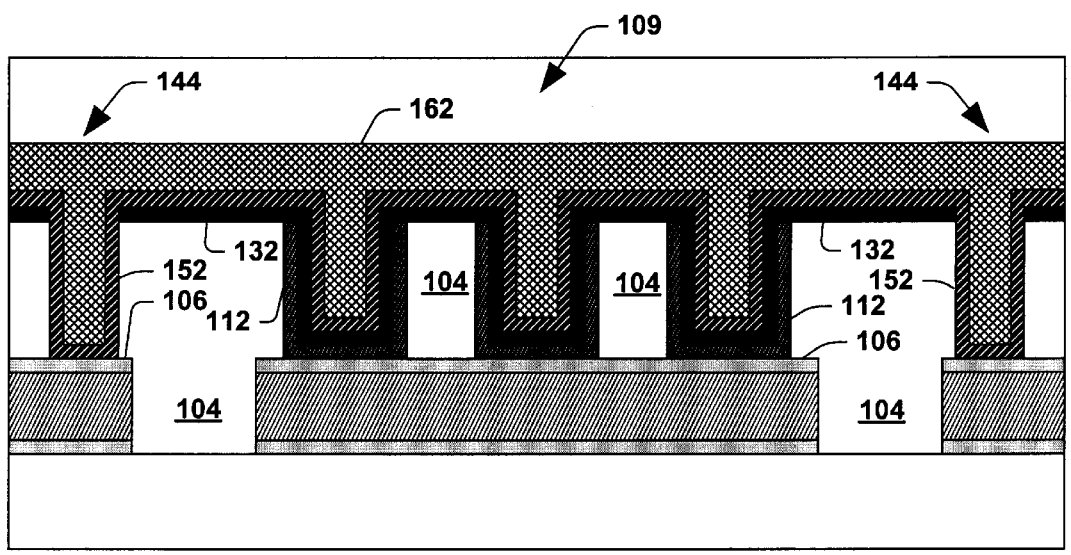
FIG. 8 is a fragmentary cross section diagram illustrating a step of forming a second barrier metal layer and plug metal layer over the standard vias and dielectric layer, thereby filling the standard vias and capacitor array according to the prior art.

Following the standard via photoresist mask and etch operation at step 140 in FIG. 1, a second barrier metal deposition at step 150 and plug fill at step 160 are performed. FIG. 8 illustrates the formation of the second barrier metal layer 152, whereby the second barrier metal layer is formed in a generally conformal manner over the dielectric layer 132, the first insulating layer 104, and the first metal layer 106. In addition, a conductive plug layer 162 is formed over the second barrier metal layer 152 such that the one or more standard vias 144 are filled.

Figure 9:
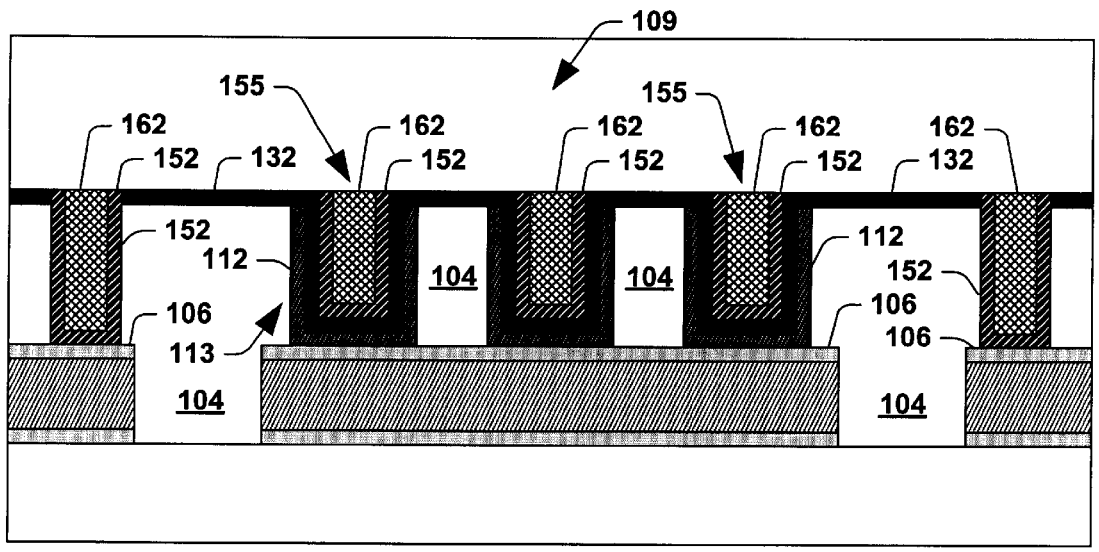
FIG. 9 is a fragmentary cross section diagram illustrating a step of planarizing the plug metal layer and the second barrier metal layer according to the prior art.

FIG. 1 further illustrates a next step of planarizing the plug layer 162 and the second barrier metal layer 152 at step 170. Referring now to FIG. 9, the conductive plug layer 162 and the second barrier metal layer 152 are planarized (e.g., using CMP techniques), thereby defining a second electrode 155 of the capacitor array 109. The planarization at step 170 also electrically isolates the capacitor array 109 from the standard vias 144 by the dielectric layer 132. The precision of the planarization at step 170 is important because the planarization must stop at about the dielectric layer 132 to avoid electrically shorting the first electrode 113 of the capacitor array 109 to the second electrode 155, however the planarization must also essentially remove all of the second barrier metal layer 152 and conductive plug layer 162 between the capacitor array 109 and the standard vias 144 in order to electrically isolate the capacitor array 109 from other components. Also, damage such as scratches in the dielectric layer 132 caused by the planarization process at step 170 can cause reliability issues in the capacitor array 109 because a scratch in the relatively thin dielectric layer 132 between the first electrode 113 and the second electrode 155 can lead to voltage leakage within the capacitor array 109.

Figure 10:
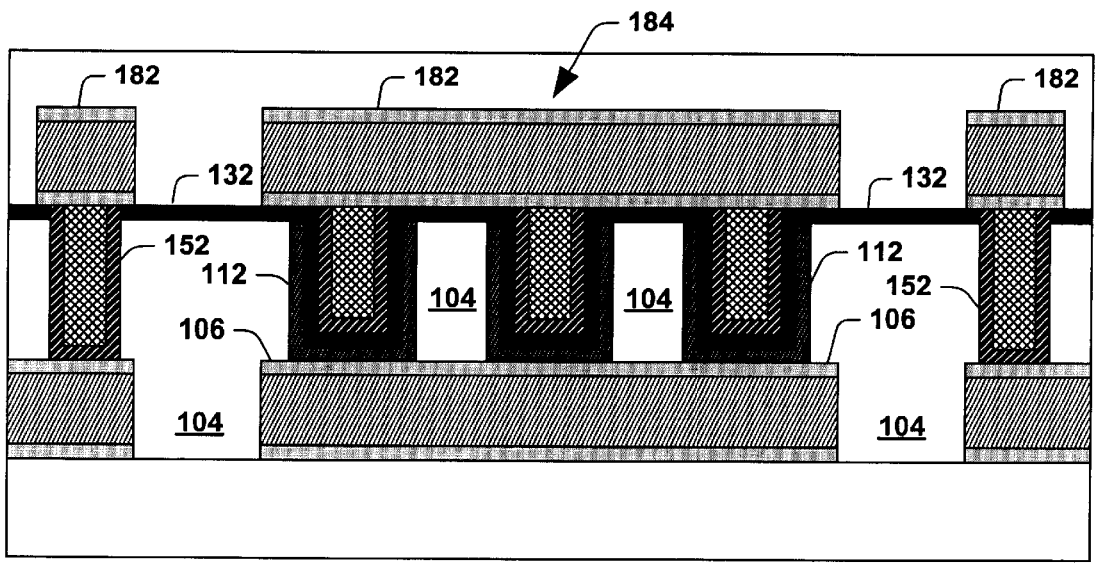
FIG. 10 is a fragmentary cross section diagram illustrating the results of standard back-end processing whereby a second conductive metal layer is patterned over the planarized plug metal and second barrier metal layer according to the prior art.

Referring again to FIG. 1, step 180 comprises a combined step of a second metal deposition and photoresist mask and etch operation, and step 190 comprises a step of standard back-end processing wherein subsequent standard IC production processes are performed to complete the integrated circuit. FIG. 10 illustrates a completed MIM capacitor 184, wherein a second metal layer 182 (e.g., second wiring layer) is patterned using standard lithographic operations to electrically connect the capacitor array 109 to other components, according to the prior art.

The method of the prior art forms the MIM capacitor 184 using an additional mask and etch step 100 in the IC production process to define the capacitor array 109 separately from defining the standard vias 144. In the prior art, the capacitor array 109 and standard vias 144 must be defined separately due to, at least in part, the plug fill at step 160 taking place after the dielectric layer 132 is formed at step 130. The plug fill at step 160 is necessary to fill both the standard vias 144 and the capacitor array 109, however, the dielectric layer 132 (which is formed before the plug fill at step 160) cannot be present in the vias 144 due to conductivity requirements within the vias 144. Thus, a separate via mask 142 must be formed at step 140 of FIG. 1 after the formation of the dielectric layer 132 at step 130 to etch the dielectric layer 132 in the formation of the standard vias 144.

The present invention is directed toward a structure and method of manufacturing a MIM capacitor using standard IC production processes which requires no additional lithographic mask operations during formation. Having no additional mask operations in the formation of the capacitor increases the efficiency of the IC production process. A flow chart diagram for forming a MIM capacitor according to one aspect of the present invention is illustrated FIG. 11. The methodology of FIG. 11 is further illustrated in various aspects and detail in FIGS. 12–37.

Figure 12:
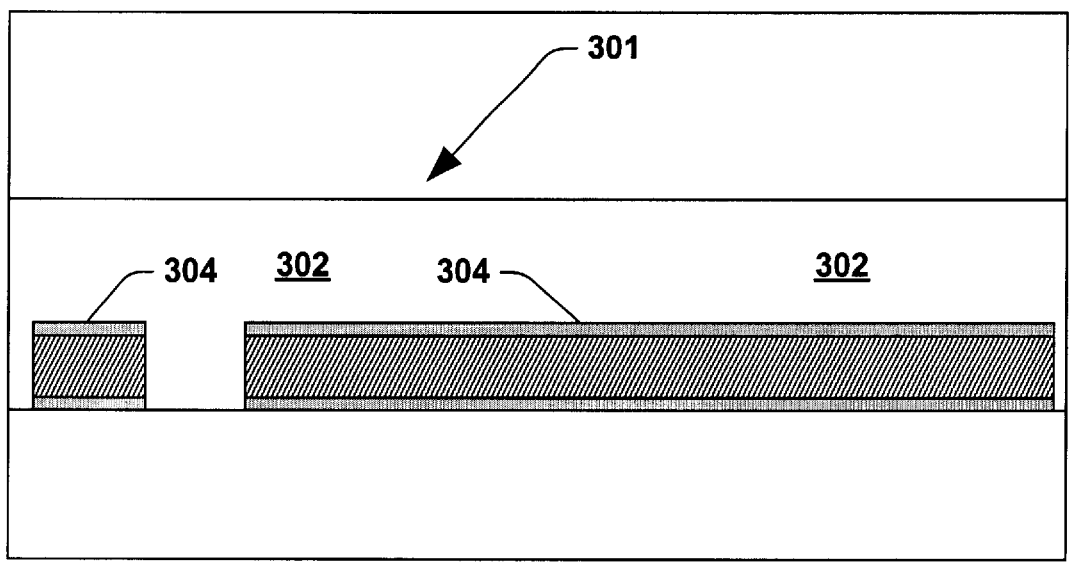
FIG. 12 is a fragmentary cross section diagram illustrating a structural foundation for forming a capacitor according to the present invention.

In one exemplary aspect of the present invention, a foundation 301 for the formation of a MIM capacitor is illustrated in FIG. 12, wherein a first electrically insulating layer 302 has been formed over a patterned first electrically conductive layer 304. The first electrically conductive layer 304 is patterned using, for example, a dry plasma etch and is illustrated as a patterned metal wiring layer in FIG. 12, however, other electrically conductive layers such as, for example, a doped polysilicon or silicided polysilicon layer are also contemplated in the present invention.

Figure 13:
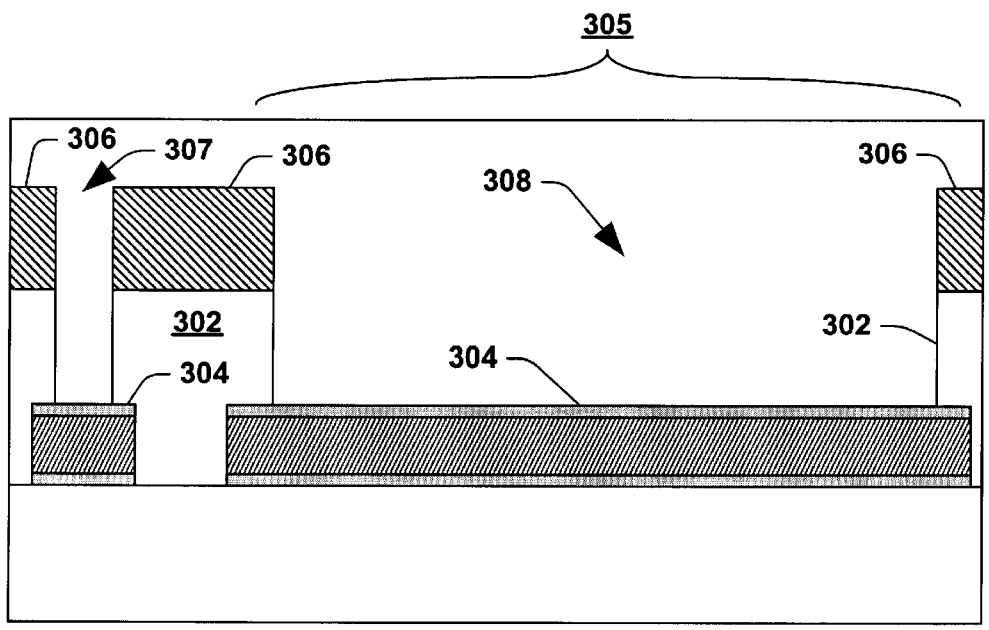
FIG. 13 is a fragmentary cross section diagram illustrating a step of forming a first photoresist mask over a first insulating layer and selectively etching the first insulating layer using a first metal layer as an etch stop, thereby defining both standard and enlarged vias according to the present invention.

Referring to FIG. 13, a capacitor region 305 is defined by utilizing a photoresist mask and etch operation at step 300. The photoresist mask and etch operation at step 300 is part of a typical IC production process wherein standard vias are formed, however, the photoresist mask is configured to form both standard vias and an enlarged via for a MIM capacitor. FIG. 13 further illustrates a photoresist mask 306 implemented to etch the first electrically insulating layer 302 using the first electrically conductive layer 304 as an etch stop to define a standard via 307 and an enlarged via 308 within the capacitor region 305. The term "enlarged via" 308 is used in the present invention to define an opening which is defined or otherwise formed along with standard vias 307 during the standard via formation at step 300 in the IC production process, and which is wider than a standard via dimension. Again referring to FIG. 11, defining both standard vias 307 and enlarged vias 308 in the capacitor region 305 at step 300 is performed using a single IC production mask process.

Figure 11:
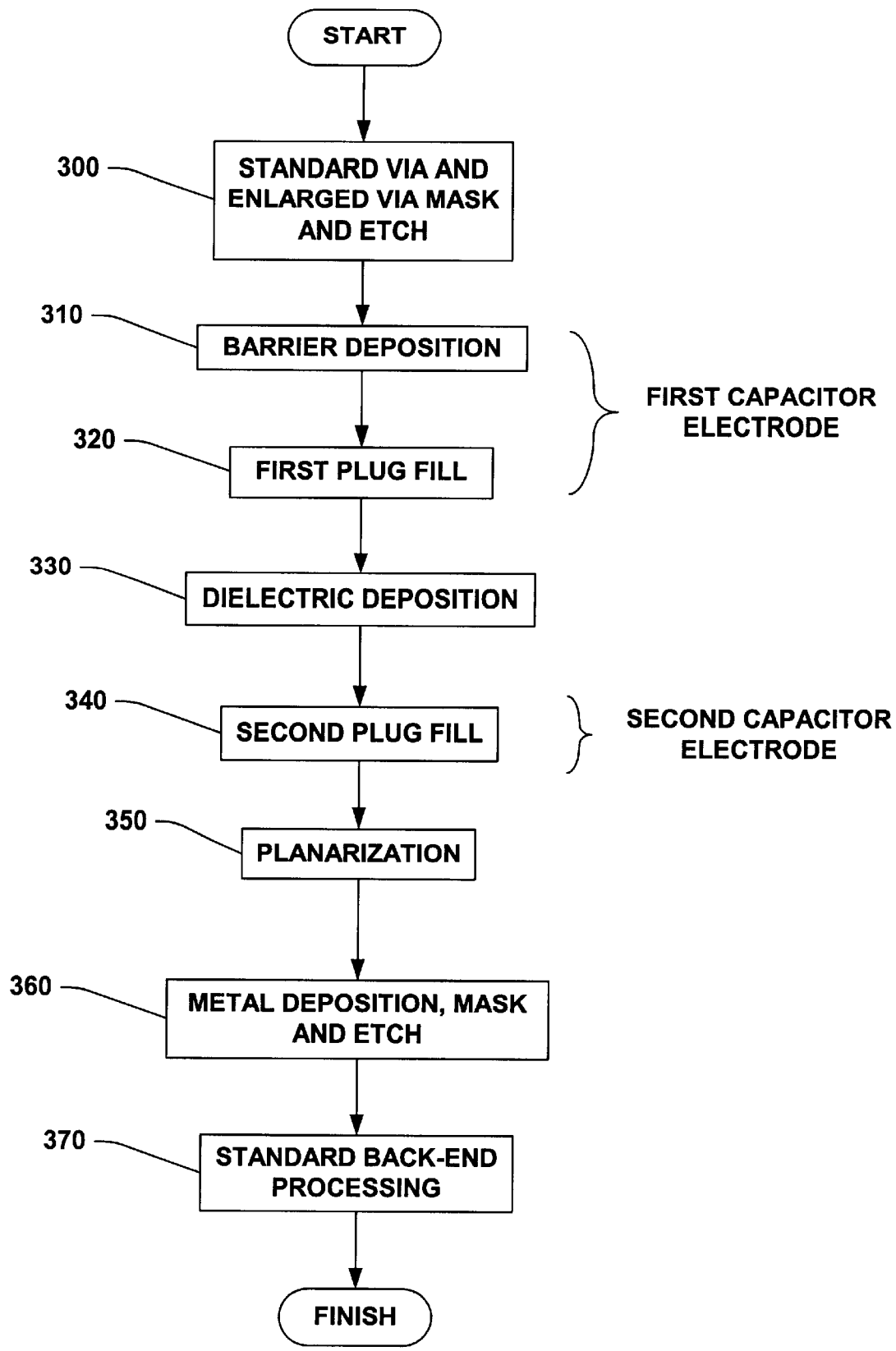
FIG. 11 is a flow chart diagram illustrating a method of fabricating an extended surface area Metal-Insulator-Metal capacitor according to one exemplary aspect of the present invention.
Figure 14:
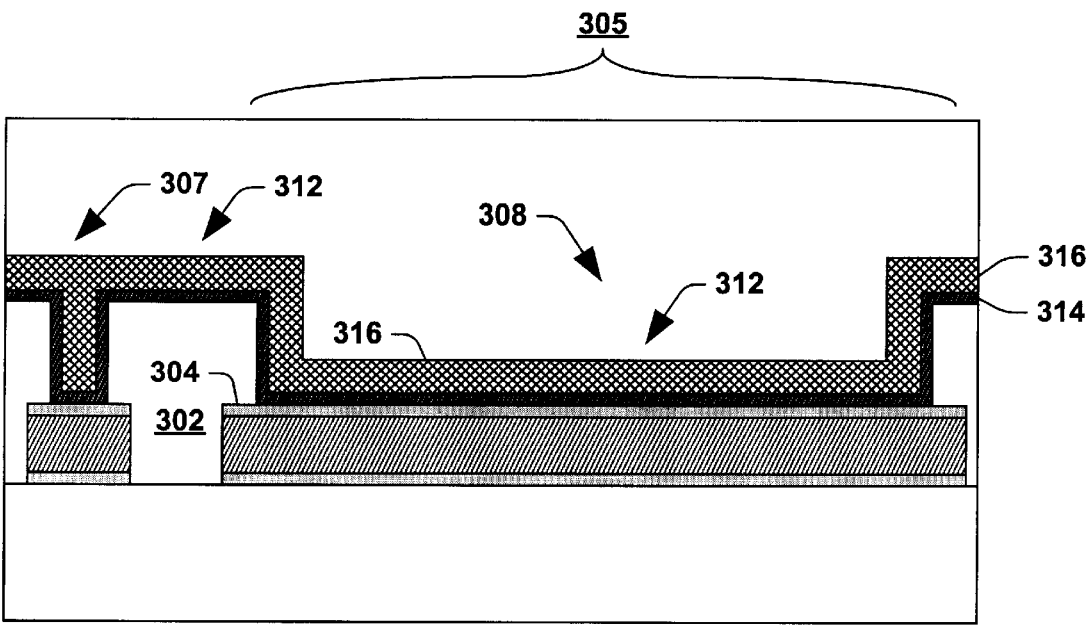
FIG. 14 is a fragmentary cross section diagram illustrating a step of forming a barrier metal layer and plug metal layer over the first insulating layer, thereby filling the standard via and overlying the enlarged via in a conformal manner according to the present invention.

The next step in the process of FIG. 11 is a barrier deposition at step 310, followed by a first plug fill at step 320, thus forming an electrically conductive first electrode 312 as illustrated in FIG. 14. For example, an electrically conductive barrier metal layer 314 (e.g., titanium nitride) is formed (e.g., using sputtering techniques) over the first electrically insulating layer 302 and the first electrically conductive layer 304 in a generally conformal manner at step 310. The barrier metal layer 314 acts as a physical barrier for material migration and contamination, as well as leakage prevention. An electrically conductive first plug metal layer 316 is subsequently formed over the barrier metal layer 314 at step 320, such that the first plug metal 316 fills the standard via 307 and overlies the enlarged via 308 in a generally conformal manner. A metal such as, for example, tungsten or copper is selected for the first plug metal layer 316 because the metal will sufficiently fill holes and high aspect ratio structures, while overlying other structures in a generally conformal manner.

Figure 15:
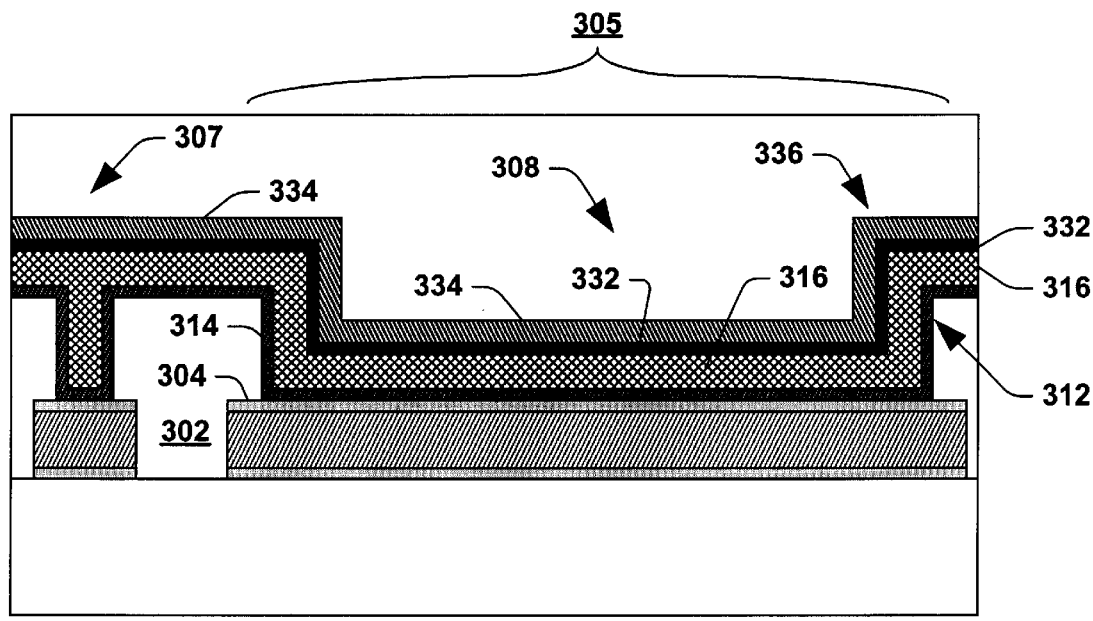
FIG. 15 is a fragmentary cross section diagram illustrating a step of forming a dielectric layer over the plug metal layer and forming a protective metal layer over the dielectric layer according to the present invention.

Referring again to the flowchart of FIG. 11, a dielectric deposition at step 330 is performed (e.g., via low temperature, plasma enhanced CVD), followed by a second plug fill operation at step 340. FIG. 15 illustrates a dielectric layer 332 which is formed over the first plug layer 316 in a generally conformal manner at step 330, followed by a second plug layer 334 which is formed over the dielectric layer 332 in a generally conformal manner at step 340, thus forming an electrically conductive second electrode 336. In one exemplary aspect of the present invention, the second plug layer 334 is comprised of a plug metal such as, for example, tungsten. In another exemplary aspect of the present invention, the second plug layer 334 comprises a protective metal, such as, for example, titanium, titanium-tungsten, or titanium nitride. An appropriate protective metal is selected such that the protective metal will secure the integrity of the dielectric layer 332 during subsequent planarization steps.

Figure 16:
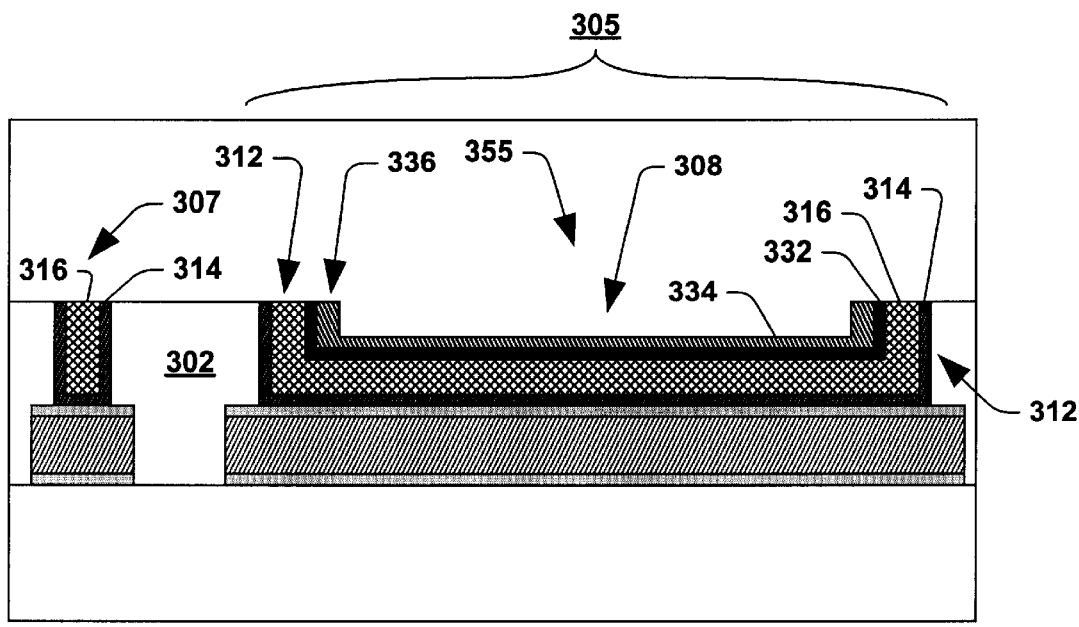
FIG. 16 is a fragmentary cross section diagram illustrating a step of planarizing the protective metal layer, the dielectric layer, the plug metal layer, and the barrier metal layer according to the present invention.

Following the second plug fill at step 340 of FIG. 11, a planarization is performed at step 350. FIG. 16 illustrates a planarization of the second plug layer 334, the dielectric layer 332, the first plug layer 316, and the barrier metal layer 314. In one exemplary aspect of the present invention, the planarization is performed using chemical mechanical polishing techniques (CMP), and is performed until the first electrically insulating layer 302 is reached between the standard via 307 and the enlarged via 308. Thus, a MIM capacitor 355 is formed within the capacitor region 305, and the capacitor 355 is electrically isolated from other IC components.

Figure 17:
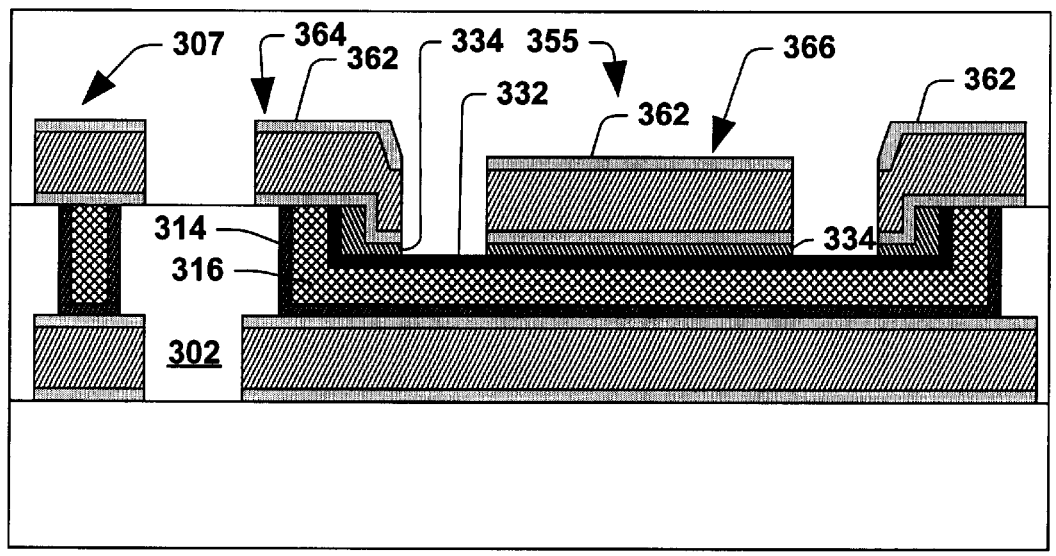
FIG. 17 is a fragmentary cross section diagram illustrating a step of patterning a second conductive metal layer over the planarized plug metal and second barrier metal layer according to the present invention.
Figure 18:
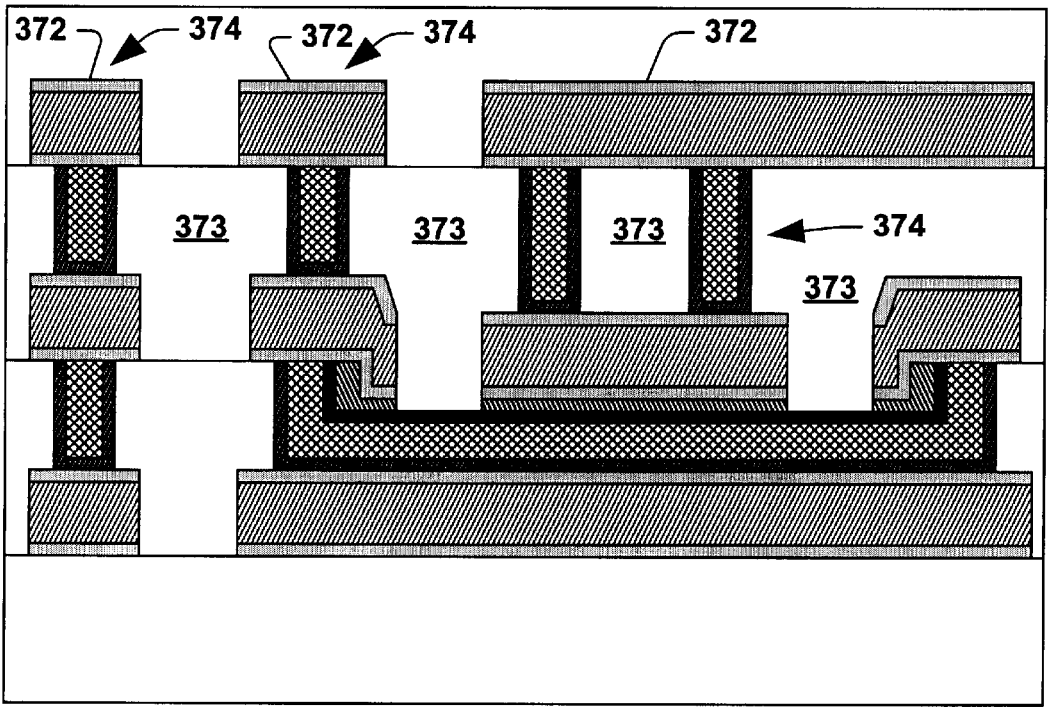
FIG. 18 is a fragmentary cross section diagram illustrating the results of standard back-end processing whereby standard connections are made to capacitor electrodes according to the present invention.

Following the planarization at step 350 of FIG. 11, a metal layer is patterned at step 360, followed by standard back-end processing at step 370. In one exemplary aspect of the present invention, as illustrated in FIG. 17, a second electrically conductive layer 362 is patterned such that a first electrode connection 364 and a second electrode connection 366 are defined, whereby other IC components can be subsequently connected to the first electrode 312 and the second electrode 336 of the MIM capacitor 355, respectively. FIG. 18 illustrates an exemplary connection scheme utilizing a third electrically conductive layer 372 patterned over an insulating layer 373 and standard vias 374 which have been formed using standard back-end processing at step 370.

While the prior art method of forming a MIM capacitor 184 of FIG. 10 requires an additional photoresist mask operation due to the formation of the capacitor array 109 of FIG. 3 and the formation of the via 144 of FIG. 7 being performed respectively in two separate mask operations at steps 100 and 140 of FIG. 1, the MIM capacitor 355 of FIG. 17 which is formed by the method of tile present invention requires no additional mask operation in the IC production process, since the standard via 307 and the enlarged via 308 (which establishes the capacitor region 305) of FIG. 13 are both formed during the single mask operation at step 300 of FIG. 11. The primary benefit of not requiring an additional mask operation in the formation of a MIM capacitor is a reduction in both manufacturing cost and production time in the IC production process. Since the single mask operation at step 300 is already being performed in the formation standard vias for a typical IC, the method of the present invention allows a MIM capacitor to also be incorporated into the integrated circuit design with minimal modifications to the production process, thus decreasing both manufacturing cost and production time.

The method of FIG. 11 may also be employed to fabricate a multi-trench type MIM capacitor which will exhibit a larger capacitance per unit area than the resultant MIM capacitor of FIGS. 17 and 18. The multi-trench MIM capacitor can be formed using a plurality of enlarged vias, wherein the enlarged vias are interconnected to form a single capacitor. In accordance with the present invention, a multi-trench MIM capacitor can also be formed without the use of the additional mask and etch operation in the prior art method of FIG. 1.

Figure 19:
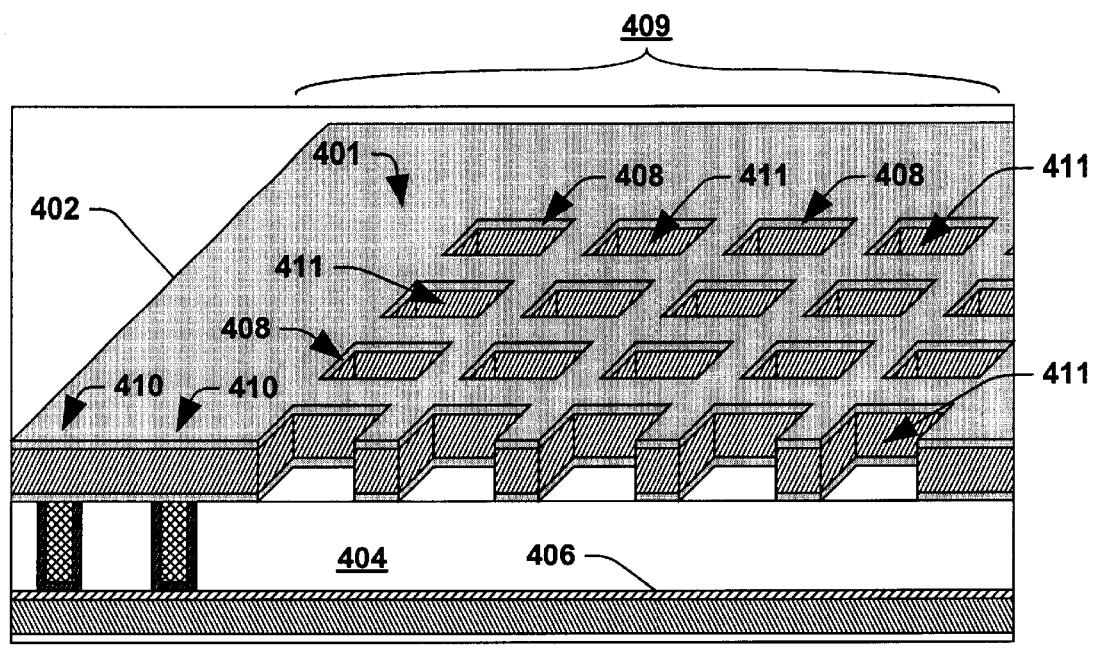
FIG. 19 is a perspective diagram illustrating an exemplary patterned first conductive metal layer over a first insulating layer according to the present invention.

According to one exemplary aspect of the present invention, a multi-trench type MIM capacitor can be fabricated utilizing a foundation 401 formed in previous IC process steps. The foundation 401 was formed by forming and patterning a first electrically conductive layer 402 (e.g., a wiring layer) as illustrated in FIG. 19 over a primary electrically insulating layer 404, thereby providing a large capacitor electrode surface area 408 in a capacitor region 409. The primary electrically insulating layer 404 was previously formed over a conductive substrate 406. The substrate 406 may comprise a silicided poly material, however, other conductive materials such as a previously formed wiring layer, etc. are contemplated in the present invention. Alternatively, any substrate may be employed such as, for example, an etch stop layer or even a dielectric material, whereby the substrate will control the depth of subsequently formed vias. However, an electrically conductive substrate has certain advantageous respects, such as benefits in high Q applications, shielding purposes, etc., and these respects will become obvious to one of ordinary skill in the art. Standard vias 410 electrically connect the first electrically conductive layer 402 to the substrate 406. The first electrically conductive layer 402 is patterned during typical IC metal layer patterning processes such that a plurality of secondary enlarged via regions 411 are formed in the capacitor region 409.

Figure 20:
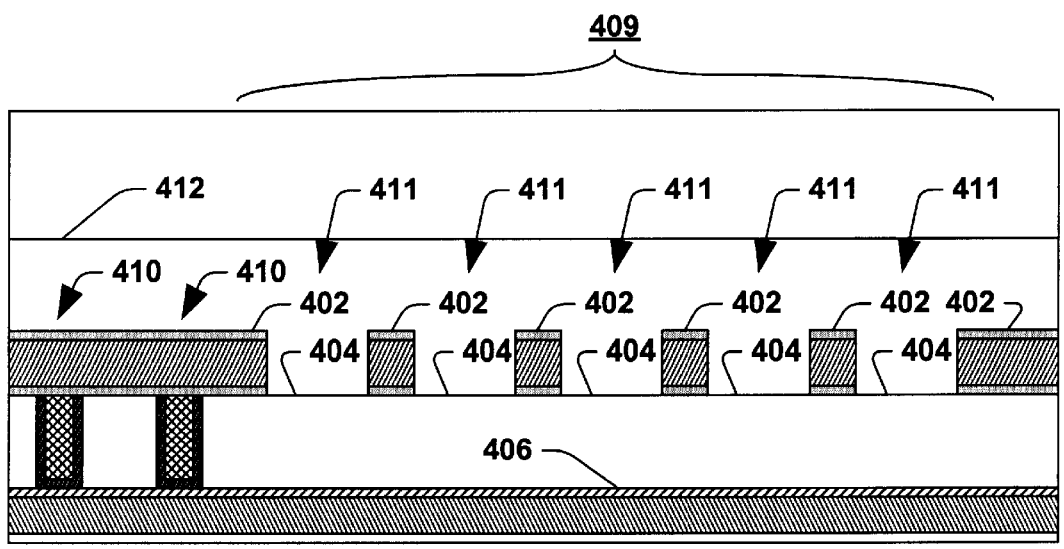
FIG. 20 is a fragmentary cross section diagram of FIG. 19 illustrating a structural foundation for forming a capacitor over a first electrically insulating layer according to the present invention.
Figure 21:
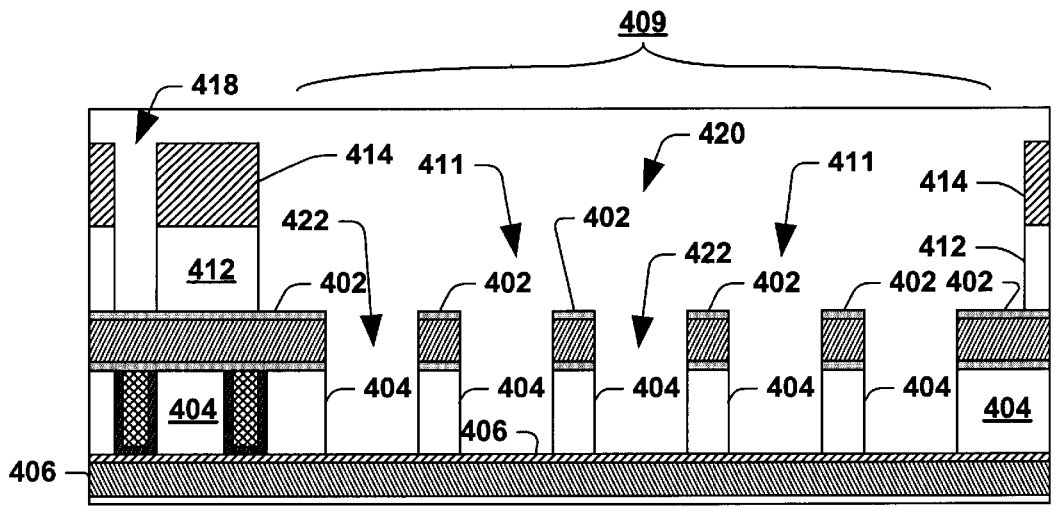
FIG. 21 is a fragmentary cross section diagram illustrating a step of forming a first photoresist mask over a first insulating layer and primary insulating layer and selectively etching the first insulating layer using a first metal layer as an etch stop, in addition to etching the primary insulating layer using the first metal layer as a mask, thereby defining both standard and enlarged vias according to the present invention.

FIG. 20 illustrates a cross section of the capacitor region 409 shown in FIG. 19, wherein a first electrically insulating layer 412 has been formed over the patterned first electrically conductive layer 402. A standard via and primary enlarged via photoresist mask 414 is formed and an etch operation is performed at step 300 of FIG. 11, and is illustrated in FIG. 21. During step 300, the first electrically insulating layer 412 is etched using the first electrically conductive layer 402 as an etch stop, thereby defining a standard via 418 and a primary enlarged via 420, and the primary electrically insulating layer 404 is etched using the first electrically conductive layer 402 as a mask while utilizing the substrate 406 as an etch stop, thereby forming a plurality of secondary enlarged vias 422 in the plurality of secondary enlarged via regions 411. The secondary enlarged vias 422 can therefore be considered laterally contained within the primary enlarged via 420. Consequently, the formation of the primary enlarged via 420 and the secondary enlarged vias 422 are performed during the same process step as the formation of standard vias 418, thus requiring no additional mask steps in the IC production process.

Figure 22:
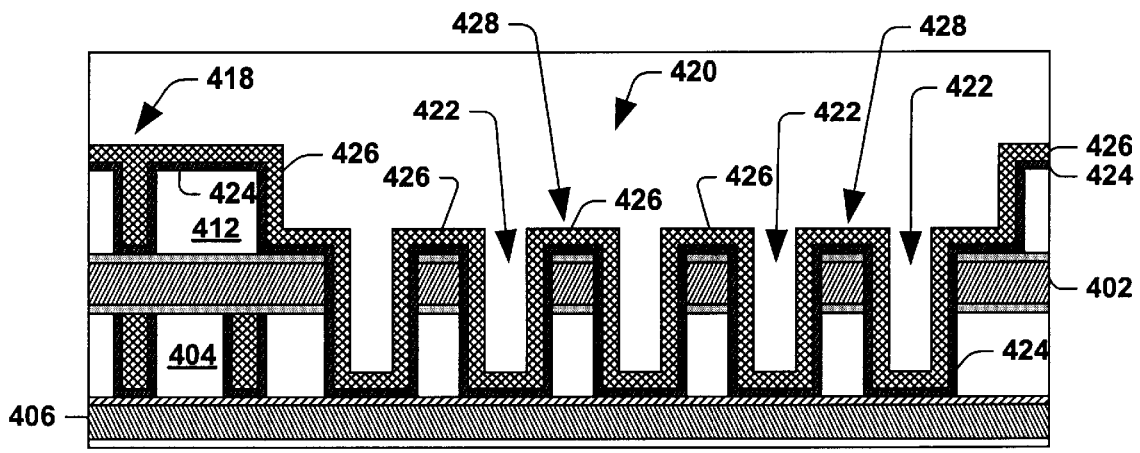
FIG. 22 is a fragmentary cross section diagram illustrating a step of forming a barrier metal layer and first plug metal layer over the first insulating layer and primary insulating layer, thereby filling the standard via and overlying the enlarged vias in a conformal manner according to the present invention.

FIG. 22 illustrates a barrier deposition at step 310 of FIG. 11, wherein an electrically conductive barrier metal layer 424 is formed which overlays the first electrically insulating layer 412, the first electrically conductive layer 402, the primary electrically insulating layer 404, and the substrate 406 in a generally conformal manner. Step 320 of FIG. 11 is then performed, wherein a first plug layer 426 is formed over the electrically conductive barrier metal layer 424, thereby filling the standard via 418 and overlaying the electrically conductive barrier metal layer 424 in the primary enlarged via 420 and the secondary enlarged vias 422 in a generally conformal manner. Steps 310 and 320 form an electrically conductive first electrode 428, wherein the electrically conductive barrier metal layer 424 electrically contacts the first electrically conductive layer 402 at a plurality of points across the primary enlarged via 420 and the secondary enlarged vias 422. The first electrically conductive layer 402 (which interlaces the first electrode 428) and the substrate 406 (which is electrically connected to the first electrically conductive layer 402 by the standard vias 410) contact the first electrode 428 at a plurality of points, thereby increasing conductivity to the first electrode 428 across the capacitor electrode surface area 408. As more points contact the first electrode 428, a better Q value for RF applications can be achieved, as well as a decrease in serial resistance. The structure of the first electrically conductive layer 402 can be optimized such that an optimal Q value versus density characteristic can be achieved.

Figure 23:
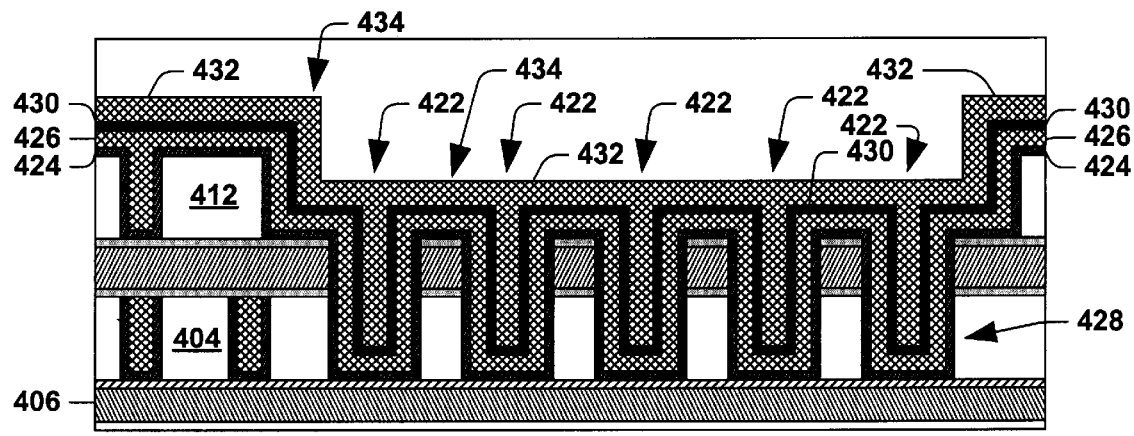
FIG. 23 is a fragmentary cross section diagram illustrating a step of forming a dielectric layer over the first plug metal layer and forming a second plug metal layer over the dielectric layer according to the present invention.
Figure 24:
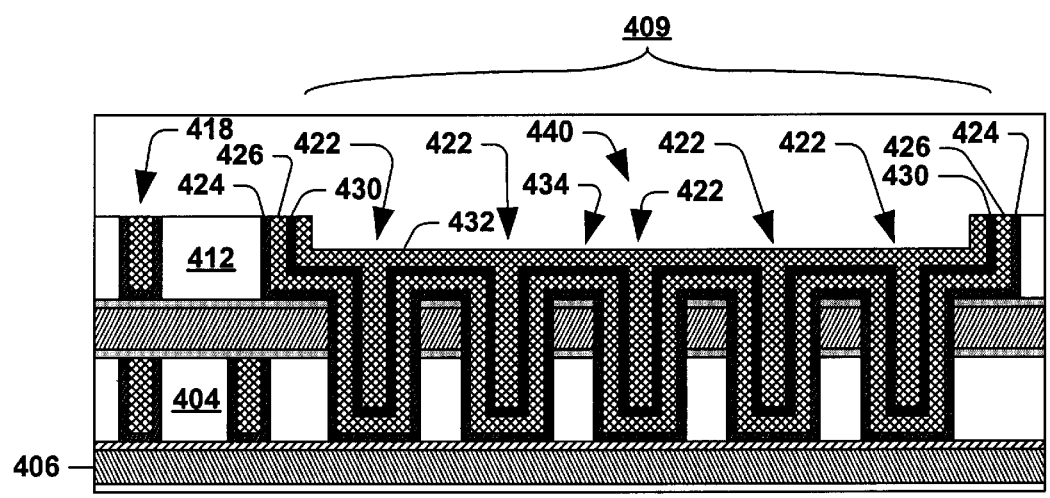
FIG. 24 is a fragmentary cross section diagram illustrating a step of planarizing the second plug metal layer, the dielectric layer, the first plug metal layer, and the barrier metal layer according to the present invention.

Referring now to FIG. 23, a dielectric layer 430 is formed at step 330 of FIG. 11, wherein the dielectric layer 430 is formed over the first plug layer 426 in a generally conformal manner. A second plug layer 432 is then formed at step 340 of FIG. 11, wherein the second plug layer 432 overlays the dielectric layer 430, and fills secondary enlarged vias 422, thus defining an electrically conductive second electrode 434. Step 350 of FIG. 11 is then performed by planarizing (e.g., by using CMP techniques) the second plug layer 432, the dielectric layer 430, the first plug layer 426, and the barrier metal layer 424 until the first electrically insulating layer 412 is reached, such that a capacitor 440 in the capacitor region 409 is electrically isolated from other components, as illustrated in FIG. 24. In one exemplary aspect, the upper surface of the planarized second electrode 434 is lower than the upper surface of the first electrically insulating layer 412, such that planarization does not significantly remove material from the second electrode 434 within the primary enlarged via 420, thug providing sufficient conductivity of the second electrode 434 for the capacitor 440.

Figure 25:
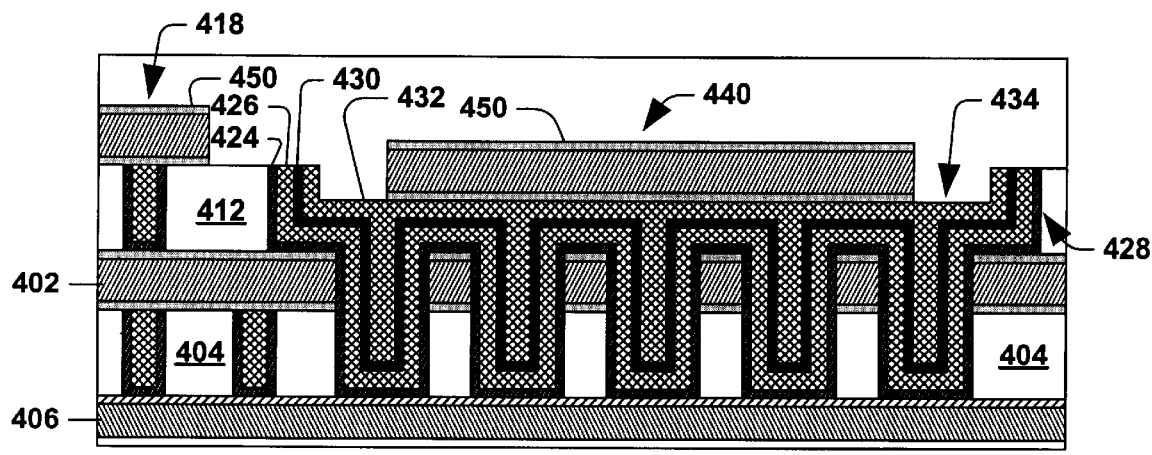
FIG. 25 is a fragmentary cross section diagram illustrating a step of patterning a second conductive metal layer according to the present invention.
Figure 26:
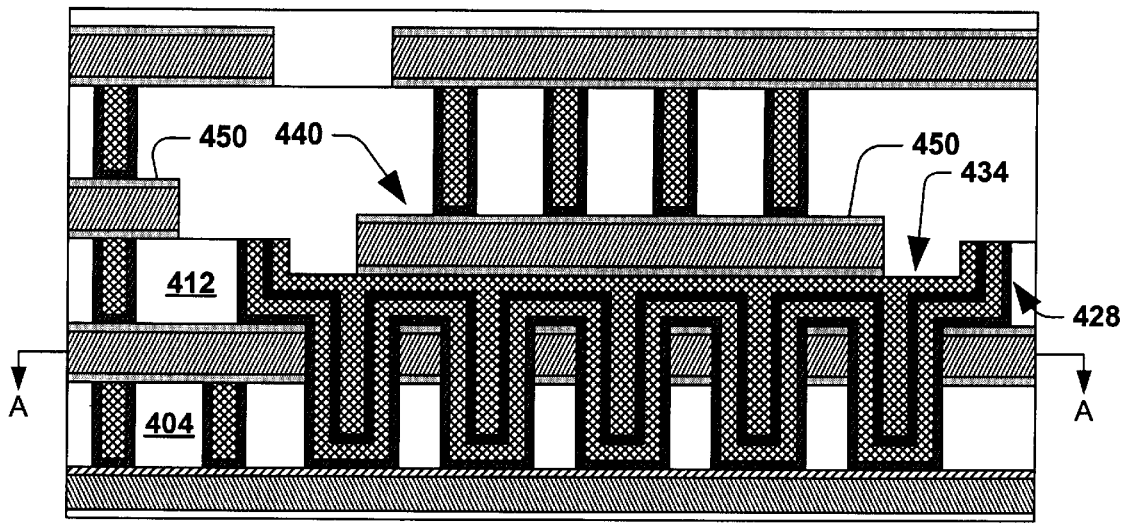
FIG. 26 is a fragmentary cross section diagram illustrating the results of standard back-end processing whereby standard connections are made to capacitor electrodes according to the present invention.

FIG. 25 illustrates the results of performing step 360 of FIG. 11, wherein a second electrically conductive layer 450 is deposited and patterned over the second plug layer 432 and the standard via 418, thereby forming electrical connections to the second electrode 434 and the first electrode 428 of the capacitor 440, respectively, to which other components may subsequently be connected. FIG. 26 illustrates the results of performing step 370, wherein standard back-end processing is performed such that other components are electrically connected to the capacitor 440.

Figure 27:
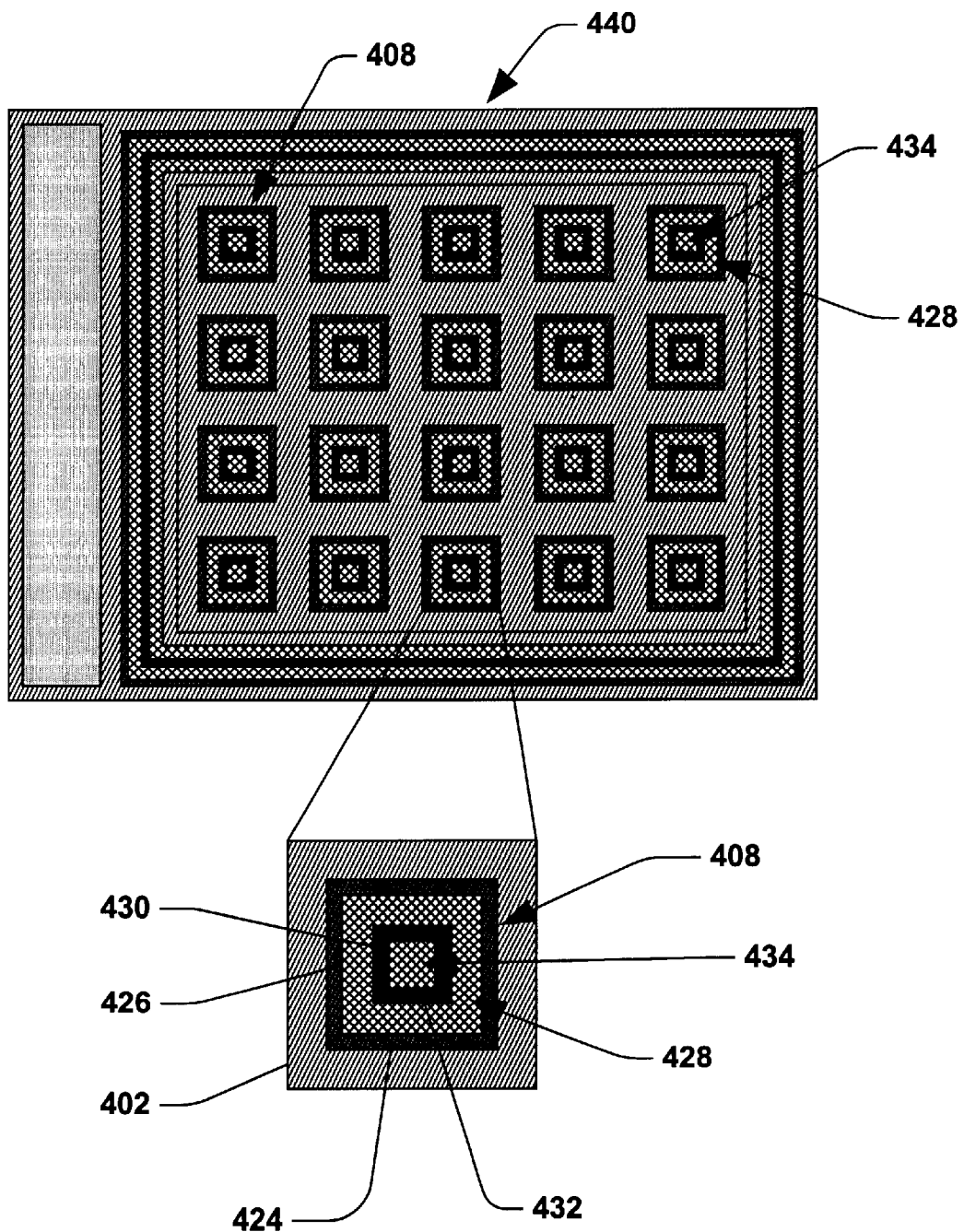
FIG. 27 is an plan view diagram illustrating an exemplary pattern of an large surface area capacitor according to the present invention.
Figure 28:
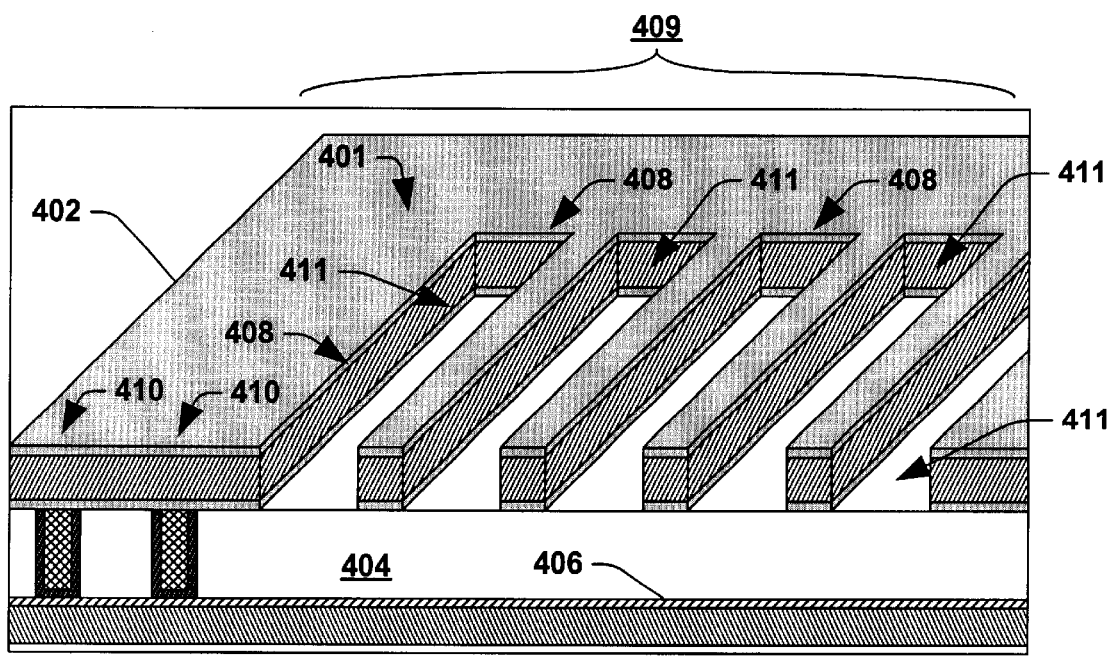
FIG. 28 is a perspective diagram illustrating an exemplary large surface area multi-trench patterned first conductive metal layer over a first insulating layer according to the present invention.
Figure 29:
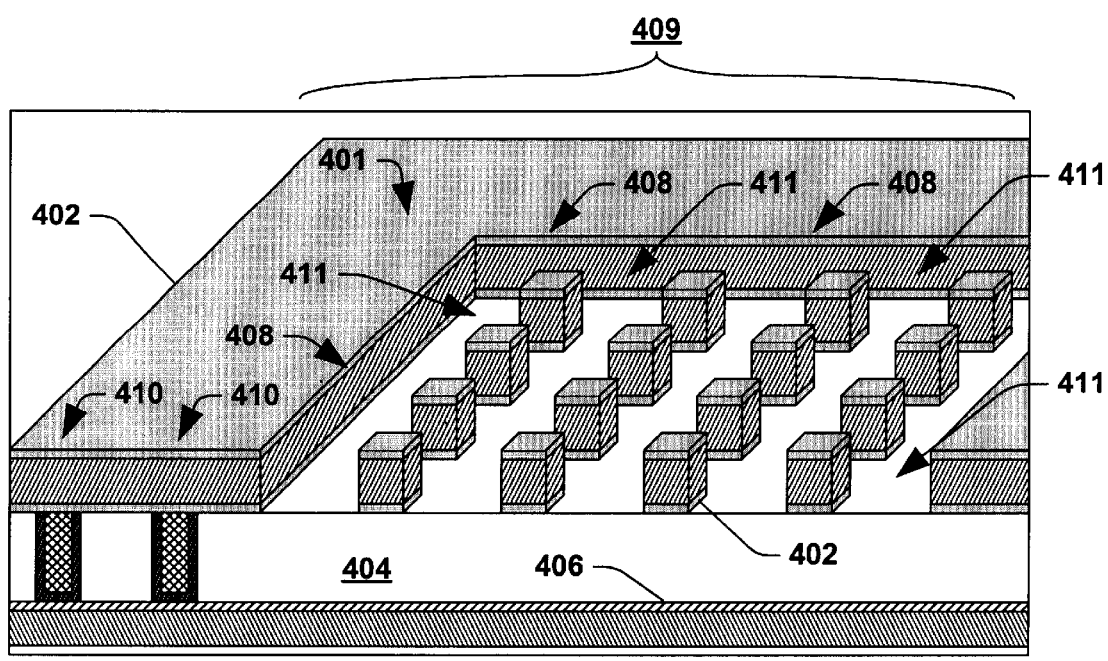
FIG. 29 is a perspective diagram illustrating an exemplary large surface area multi-trench patterned first conductive metal layer over a first insulating layer according to the present invention.

Referring now to FIG. 27, a plan view of the exemplary capacitor 440 of FIG. 26 is illustrated, demonstrating the large capacitor surface area 408 of the first electrode 428 and second electrode 434. The capacitor surface areas 408 can be changed by modifying the pattern of the first electrically conductive layer 402. Since the patterning of the first electrically conductive layer 402 is performed during typical metal patterning operations in the IC production process, no additional mask operations are necessary to form various other large surface area multi-trench type MIM capacitors. Other exemplary first electrically conductive metal layers 402 which can form various large surface area multi-trench type MIM capacitors are illustrated in FIGS. 28 and 29.

Again, while the prior art method of forming a MIM capacitor 184 of FIG. 10 requires an additional photoresist mask operation due to the formation of the capacitor array 109 of FIG. 3 and the formation of the via 144 of FIG. 7 being performed respectively in two separate mask operations at steps 100 and 140 of FIG. 1, the high-capacitance multi-trench MIM capacitor 440 of FIG. 25 which is formed by the method of the present invention requires no additional mask operation in the IC production process, since the standard via 418 and the primary enlarged via 420 of FIG. 21 are both formed during the single mask operation at step 300 of FIG. 11. Additionally, the first electrically conductive layer 402 of FIG. 21 which was patterned in prior typical IC process operations forms the secondary enlarged vias 422 during the same mask operation at step 300 of FIG. 11. The primary benefit of not requiring an additional mask operation in the formation of a high-capacitance multi-trench MIM capacitor is a reduction in both manufacturing cost and production time in the IC production process. Since the single mask operation at step 300 is already being performed in the formation standard vias for a typical IC, and the first electrically conductive layer 402 is also patterned in typical prior operations, the method of the present invention allows a high-capacitance multi-trench MIM capacitor to also be incorporated into the integrated circuit design with minimal modifications to the production process, thus decreasing both manufacturing cost and production time.

Figure 30:
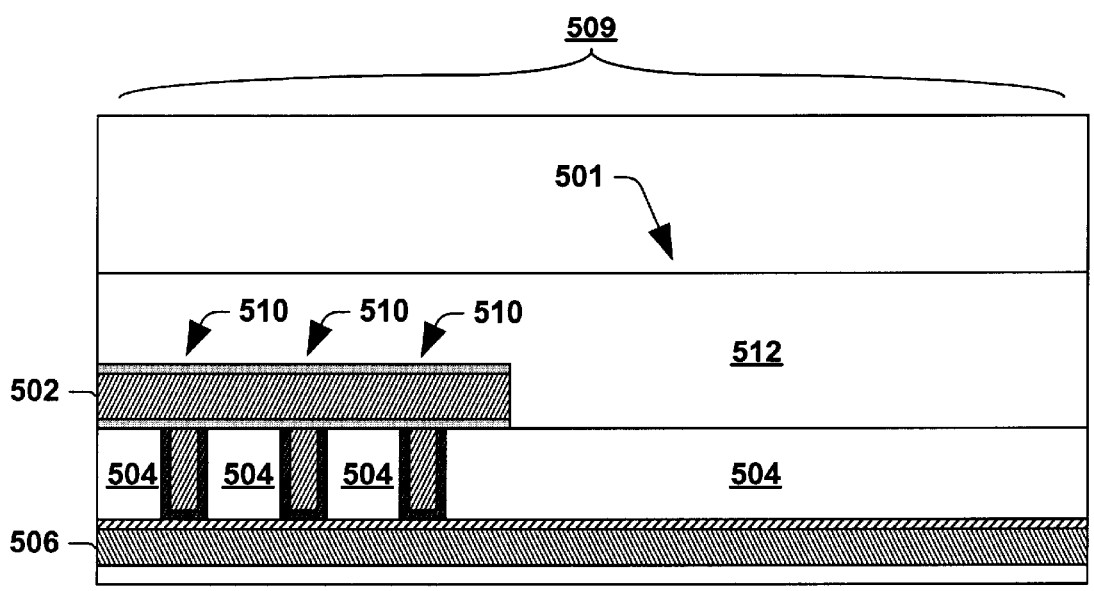
FIG. 30 is a fragmentary cross section diagram illustrating a structural foundation for forming an exemplary large surface area multi-trench capacitor over a first electrically insulating layer according to the present invention.

According to another exemplary aspect of the present invention, a capacitor structure which has large capacitor electrode surface area and a minimal footprint can be formed using no additional mask operations. The structure of the capacitor maximizes electrode surface area, while allowing for connectivity to other components. A small-footprint multi-trench type MIM capacitor can be fabricated utilizing a foundation 501 formed during previous IC process steps. The foundation 501 is fabricated by forming and patterning a first electrically conductive layer 502 (e.g., a wiring layer) as illustrated in FIG. 30 over a primary electrically insulating layer 504, thereby forming a capacitor region 509. The primary electrically insulating layer 504 is previously formed over a conductive substrate 506. The substrate 506 may comprise a silicided poly material, however, other conductive materials such as a previously formed wiring layer, etc. are contemplated in the present invention. Standard vias 510 electrically connect the first electrically conductive layer 502 to the substrate 506. The foundation 501 further comprises a first electrically insulating layer 512 which has been formed over the first electrically conductive layer 502 and the primary electrically insulating layer 504.

Figure 31:
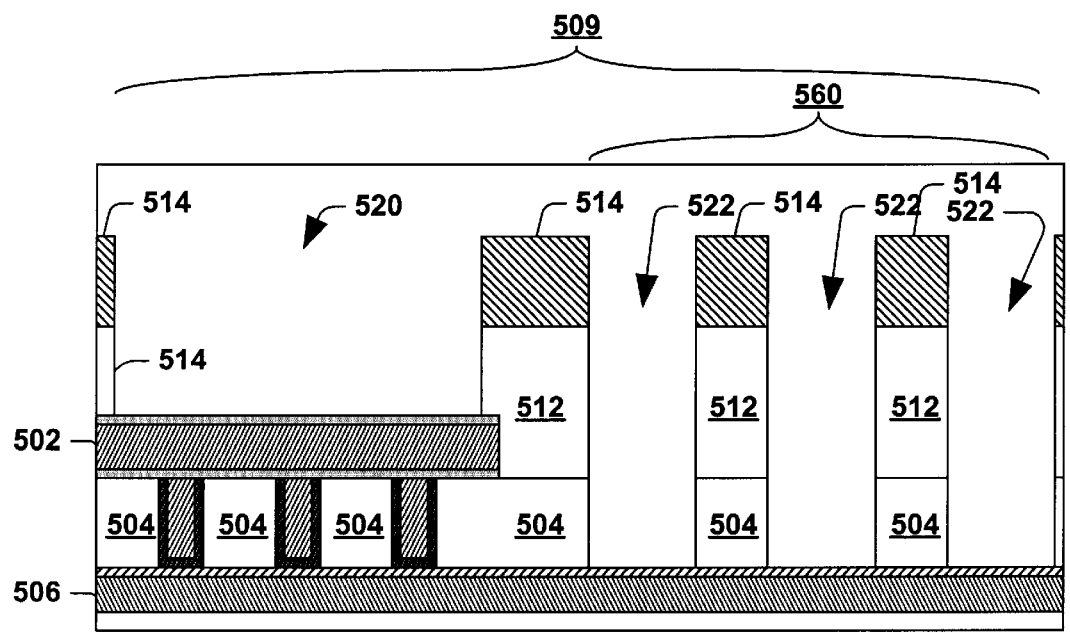
FIG. 31 is a fragmentary cross section diagram illustrating a step of forming a first photoresist mask over a first insulating layer and primary insulating layer and selectively etching the first insulating layer using a first metal layer as an etch stop, in addition to etching the primary insulating layer using the first metal layer as a mask, thereby defining both standard and enlarged vias according to the present invention.

The standard and enlarged via mask and etch operation at step 300 of FIG. 11 is performed, forming a photoresist mask 514 over the foundation 501 as illustrated in FIG. 31. The etch process at step 300 utilizes the first electrically conductive layer 502 and the substrate 506 as etch stops in etching the first electrically insulating layer 512 and the primary electrically insulating layer 504, thereby forming a standard via (not shown) an enlarged primary via 520, and a plurality of enlarged secondary vias 522 in a secondary enlarged via region 560.

Figure 32:
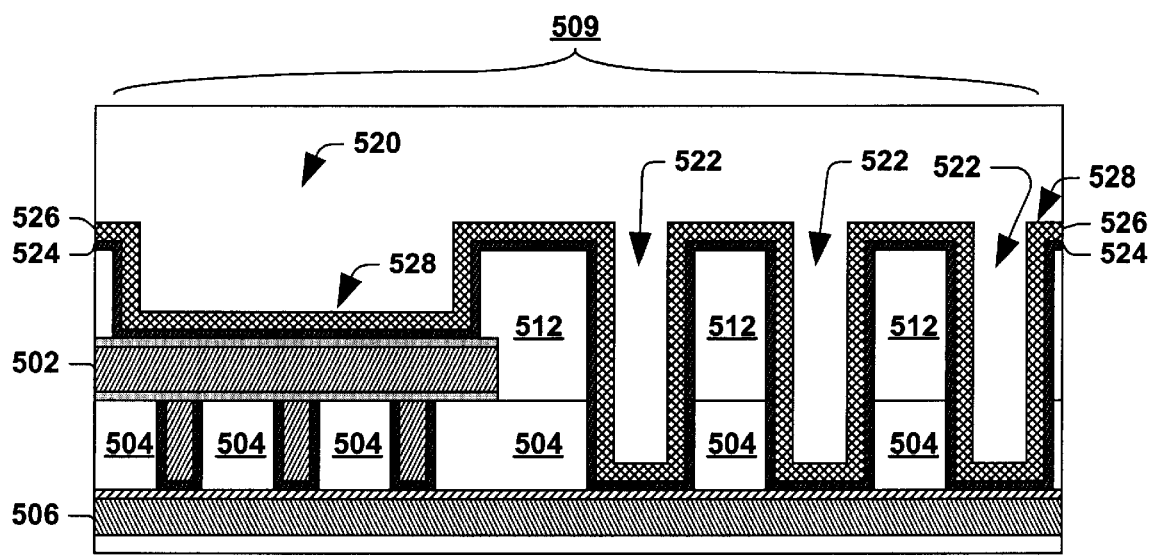
FIG. 32 is a fragmentary cross section diagram illustrating a step of forming a barrier metal layer and first plug metal layer over the first insulating layer and primary insulating layer, thereby filling the standard via and overlying the enlarged vias in a conformal manner according to the present invention.

Referring now to FIG. 32, an electrically conductive barrier metal layer 524 is formed at step 310 which overlays the first electrically insulating layer 512, the first electrically conductive layer 502, the primary electrically insulating layer 504, and the substrate 506 in a generally conformal manner. Step 320 of FIG. 11 is then performed, wherein a first plug layer 526 is formed over the barrier metal layer 524, thereby filling a standard via (not shown) which electrically contacts the first electrically conductive layer 502, and overlaying the barrier metal layer 524 in the primary enlarged via 520 and secondary enlarged vias 522 in a generally conformal manner, thus forming a first electrode 528 in the capacitor region 509.

Figure 33:
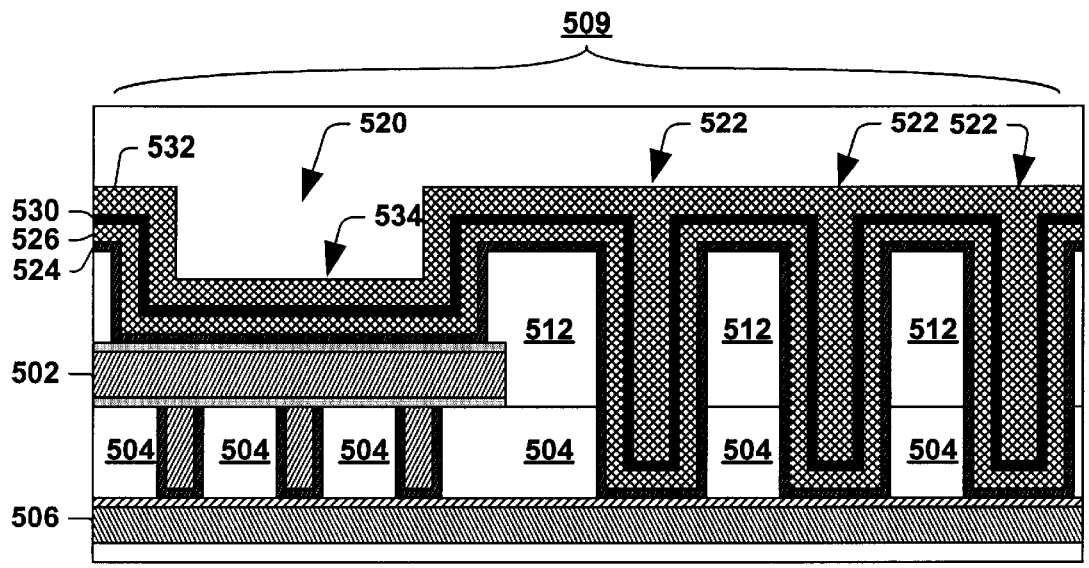
FIG. 33 is a fragmentary cross section diagram illustrating a step of forming a dielectric layer over the first plug metal layer and forming a second plug metal layer over the dielectric layer according to the present invention.
Figure 34:
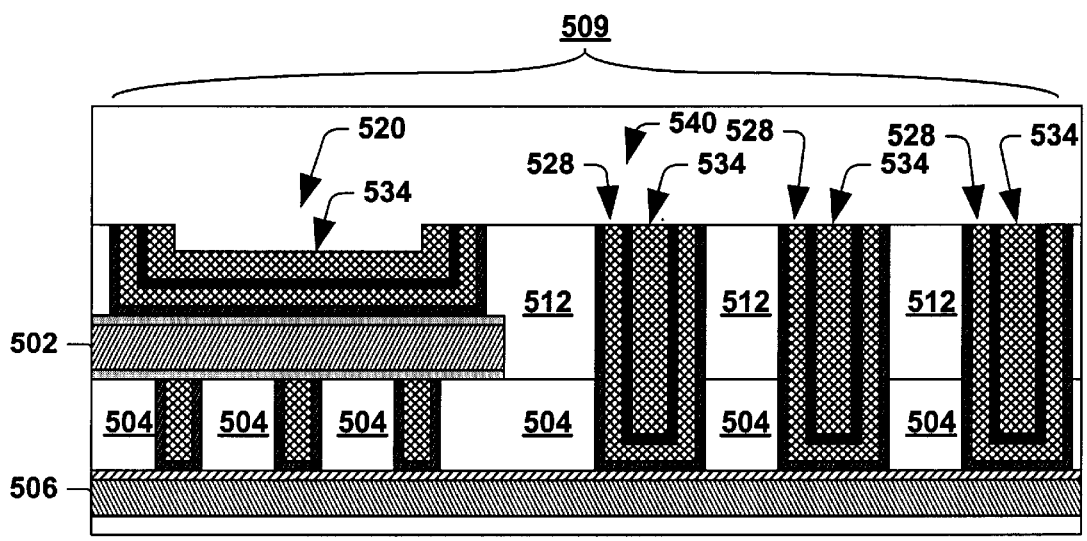
FIG. 34 is a fragmentary cross section diagram illustrating a step of planarizing the second plug metal layer, the dielectric layer, the first plug metal layer, and the barrier metal layer according to the present invention.

A dielectric layer 530 is then formed at step 330 of FIG. 11, and is illustrated in FIG. 33, wherein the dielectric layer 530 is formed over the first plug layer 526 in a generally conformal manner. A second plug layer 532 is then formed over the dielectric layer 530 at step 340 of FIG. 11, wherein the second plug layer 532 fills the secondary enlarged vias 522 and overlays the primary enlarged via in a generally conformal manner, thus forming a second electrode 534 in the capacitor region 509, wherein the capacitor region 509 comprises both the primary enlarged via 520 and the secondary enlarged vias 522. Step 350 of FIG. 11 is then performed by planarizing (e.g., by using CMP techniques) the second plug layer 532, the dielectric layer 530, the first plug layer 526, and the barrier metal layer 524 as illustrated in FIG. 34, such that a capacitor 540 is formed in the capacitor region 509. The planarization at step 350 is performed until the first electrically insulating layer 512 is reached, thereby electrically isolating the capacitor 540 from other components.

Figure 35:
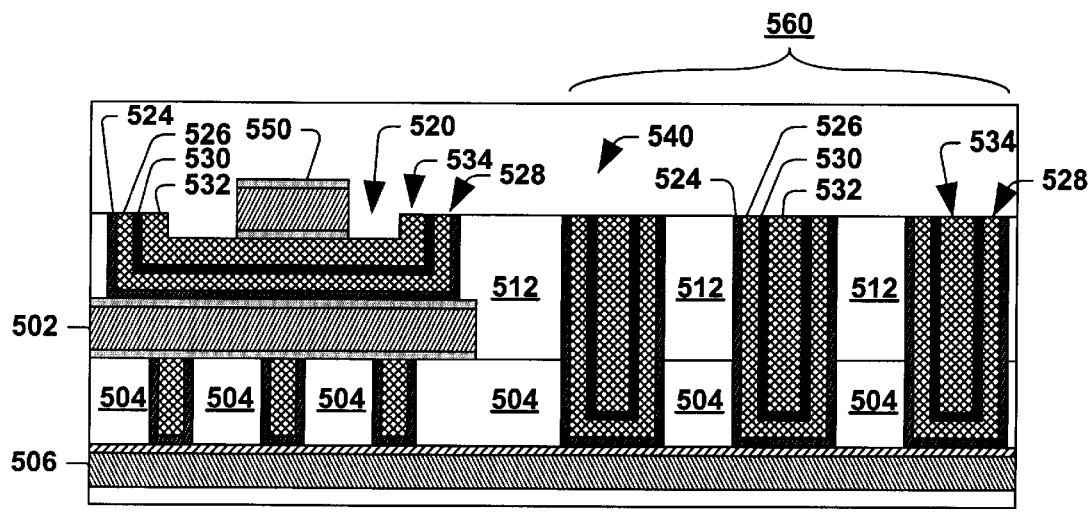
FIG. 35 is a fragmentary cross section diagram illustrating a step of patterning a second conductive metal layer according to the present invention.
Figure 36:
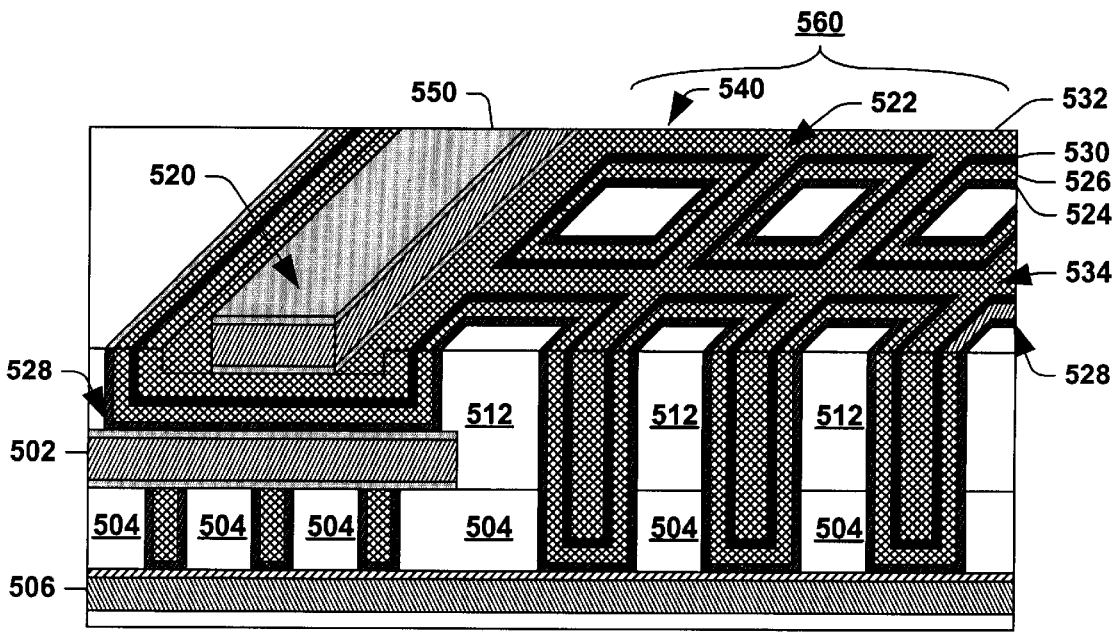
FIG. 36 is a perspective diagram illustrating an exemplary large surface area multi-trench capacitor according to the present invention.

FIG. 35 illustrates the results of performing step 360, wherein a second electrically conductive layer 550 is patterned over the standard via (not shown), thereby forming an electrical connection to the first electrode 528 of the capacitor 540. The second electrically conductive layer 550 is also patterned over the second plug layer 526 in the primary enlarged via 520 during the same step, thereby forming an electrical connection to the second electrode 534 of the capacitor 540. FIG. 36 is a perspective diagram which further illustrates the results of performing step 360, wherein the electrical connection to the first electrode 528 and the second electrode 534 of the capacitor 540 is formed. By forming the electrical connections of the first electrode 528 to the standard via (not shown) and the second electrode 534 to the second plug layer 526 in the primary enlarged via 520, the second electrically conductive layer 550 is not required in the secondary enlarged via region 560, thereby allowing the width and spacing between the secondary enlarged vias 522 to be decreased to create a greater density of secondary enlarged vias 522 in the secondary enlarged via region 560. The greater density of secondary enlarged vias 522 in the secondary enlarged via region 560 can increase the total capacitor surface area, thereby increasing the capacitance of the capacitor 540 without increasing the lateral dimensions of the capacitor 540.

After patterning the second electrically conductive layer 550 at step 360 of FIG. 11, standard back-end processing is then performed at step 370, thereby connecting the capacitor 540 to other components in the IC.

Again, while the prior art method of forming a MIM capacitor 184 of FIG. 10 requires an additional photoresist mask operation due to the formation of the capacitor array 109 of FIG. 3 and the formation of the via 144 of FIG. 7 being performed respectively in two separate mask operations at steps 100 and 140 of FIG. 1, the small-footprint multi-trench MIM capacitor 540 of FIG. 34 which is formed by the method of the present invention requires no additional mask operation in the IC production process, since the standard via (which is not shown) and the primary enlarged via 520, and the secondary enlarged vias 522 of FIG. 31 are all formed during the single mask operation at step 300 of FIG. 11. The primary benefit of not requiring an additional mask operation in the formation of a small-footprint multi-trench MIM capacitor is a reduction in both manufacturing cost and production time in the IC production process. Since the single mask operation at step 300 is already being performed in the formation standard vias for a typical IC, and the first electrically conductive layer 502 is also patterned in typical prior operations, the method of the present invention allows a small-footprint multi-trench MIM capacitor to also be incorporated into the integrated circuit design with minimal modifications to the production process, thus decreasing both manufacturing cost and production time.

Figure 37:
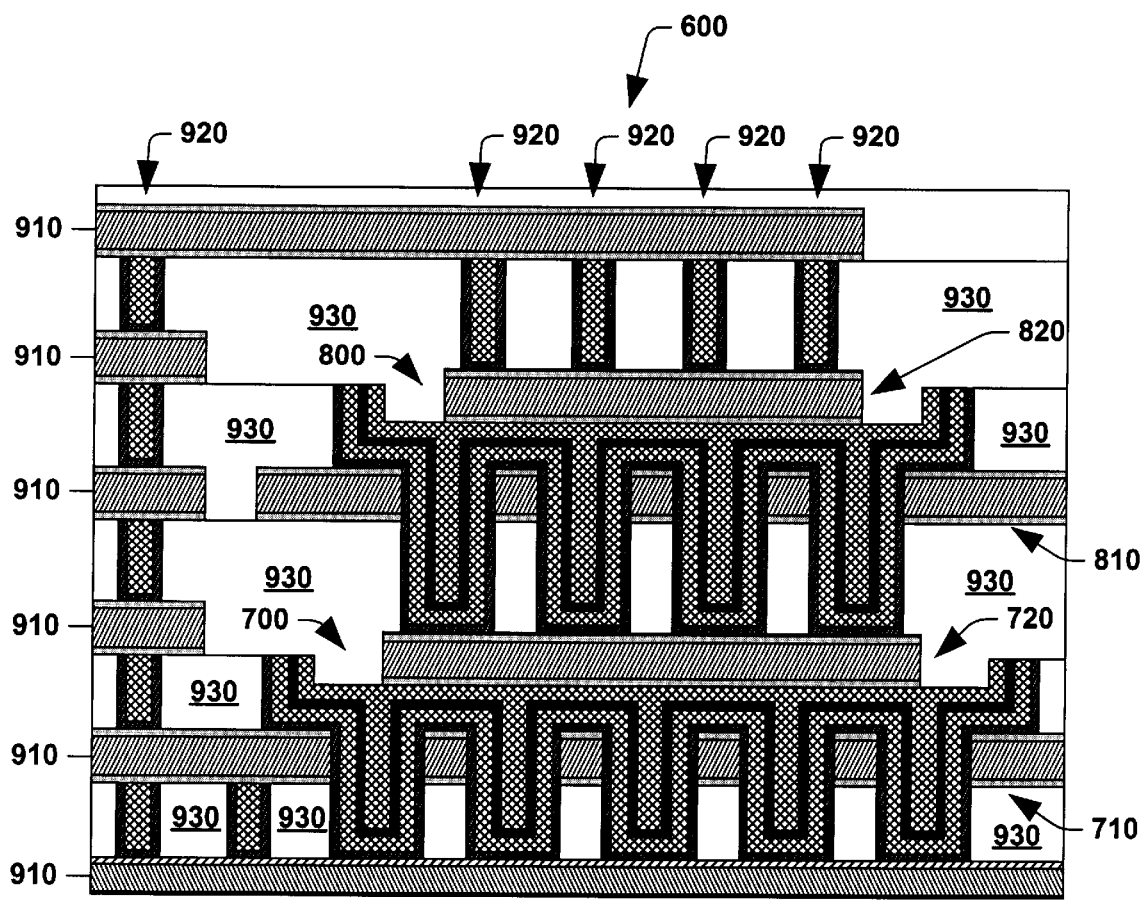
FIG. 37 is a fragmentary cross section diagram illustrating a stacked capacitor according to the present invention.

In another exemplary aspect of the present invention, a stacked capacitor 600 can be formed, as illustrated in FIG. 37. The method of the present invention can be employed as previously described to form and connect a first capacitor 700 and a second capacitor 800 in parallel, wherein the effective capacitance of the stacked capacitor 600 can be relatively large. The stacked capacitor 600 is formed, whereby first electrode 710 of the first capacitor 700 is electrically connected to the second electrode 820 of the second capacitor 800, and the second electrode 720 of the first capacitor 700 is electrically connected to the first electrode 810 of the second capacitor 800 by means of metal layers 910. The metal layers 910 can be electrically connected by standard vias 920 or electrically isolated by insulating layers 930. Further, the stacked capacitor 600 can be formed using no additional mask steps in the formation of the integrated circuit.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature maybe combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A method for forming an integrated circuit capacitor, comprising the steps of:

forming a first electrically conductive layer over a substrate;

patterning the first electrically conductive layer, thereby defining a capacitor region;

forming a first electrically insulating layer over the first electrically conductive layer;

patterning the first electrically insulating layer, thereby defining a standard via and a primary enlarged via therein;

forming an electrically conductive first electrode layer over the patterned first electrically insulating layer and first electrically conductive layer, thereby filling the standard via and overlying the primary enlarged via in a generally conformal manner;

forming a dielectric layer over the first electrode layer;

forming an electrically conductive second electrode layer over the dielectric layer; and planarizing the second electrode layer, the dielectric layer, and the first electrode layer a predetermined amount, thereby defining and laterally electrically isolating a capacitor in the capacitor region.

2. The method of claim 1, wherein the substrate comprises a semiconductor material.

3. The method of claim 1, further comprising forming a primary electrically insulating layer over the substrate prior to forming the first electrically conductive layer.

4. The method of claim 3, further comprising patterning the first electrically conductive layer within the capacitor region such that a plurality of secondary enlarged via regions are defined therein.

5. The method of claim 4, wherein patterning the first electrically insulating layer further comprises using the first electrically conductive layer as a mask for patterning the primary electrically insulating layer within the primary enlarged via, thereby defining one or more secondary enlarged vias corresponding to the one or more secondary enlarged via regions therein.

6. The method of claim 5, wherein the electrically conductive first electrode layer is formed over the first electrically insulating layer, the first electrically conductive layer, the primary insulating layer, and the substrate, thereby filling the standard via and overlying the primary enlarged via and secondary enlarged vias in a generally conformal manner.

7. The method of claim 3, wherein patterning the first electrically insulating layer further comprises patterning the first electrically insulating layer and the primary insulating layer within the capacitor region such that a plurality of secondary enlarged via regions are defined therein.

8. The method of claim 7, wherein the electrically conductive first electrode layer is formed over the first electrically insulating layer, the first electrically conductive layer, the primary insulating layer, and the substrate, thereby filling the standard via and overlying the primary enlarged via and secondary enlarged vias in a generally conformal manner.

9. The method of claim 1, wherein the first electrically conductive layer comprises a wiring layer.

10. The method of claim 1, wherein the electrically conductive first electrode layer comprises one or more electrically conductive first electrode sublayers.

11. The method of claim 10, wherein one of the electrically conductive first electrode sublayers comprises a barrier metal.

12. The method of claim 11, wherein the barrier metal comprises titanium nitride.

13. The method of claim 10, wherein one of the electrically conductive first electrode sublayers comprises a plug metal.

14. The method of claim 13, wherein the plug metal comprises tungsten.

15. The method of claim 1, wherein the electrically conductive second electrode layer comprises one or more electrically conductive second electrode sublayers.

16. The method of claim 15, wherein one of the electrically conductive second electrode sublayers comprises a plug metal.

17. The method of claim 16, wherein the plug metal comprises tungsten.

18. The method of claim 15, wherein one of the electrically conductive second electrode sublayers comprises a protective metal which protects the dielectric layer during planarization.

19. The method of claim 18, wherein the protective metal comprises a material selected from the group consisting of titanium, titanium-tungsten, and titanium nitride.

20. The method of claim 1, wherein the dielectric layer comprises a material selected from the group consisting of silicon oxide, silicon nitride, silicon oxynitride, titanium oxide, barium strontium titanate (BST), aluminum oxide, and tantalum pentoxide.

21. The method of claim 1, wherein planarizing the second electrode layer, the dielectric layer, and the first electrode layer is performed using a chemical mechanical polishing technique.

22. The method of claim 1, wherein planarizing the second electrode layer, the dielectric layer, and the first electrode layer a predetermined amount is performed at least until the first electrically insulating layer is reached.

23. The method of claim 1, further comprising the steps of:

forming a second electrically conductive layer over the planarized first electrode layer, the dielectric layer, and the second electrode layer; and patterning the second electrically conductive layer, thereby forming an electrical connection to the capacitor, to which other components may be connected.

24. The method of claim 23, wherein the second electrically conductive layer comprises a wiring layer.

25. The method of claim 23, further comprising forming and defining a stacked capacitor comprising the steps of:

defining the formed capacitor as a first capacitor;

forming a second electrically conductive layer over the planarized first capacitor second electrode layer;

patterning the second electrically conductive layer, thereby defining a first capacitor second electrode connector;

forming a second capacitor over the first capacitor second electrode connector such that a first electrode of the second capacitor electrically connects to the second electrode connector of the first capacitor, thus defining a stacked capacitor first electrode, and wherein the second capacitor comprises a planarized second electrode layer;

forming a third electrically conductive layer over the planarized second capacitor second electrode layer;

patterning the third electrically conductive layer, thereby defining a second capacitor second electrode connector; and electrically connecting the first capacitor first electrode to the second capacitor second electrode, thereby defining a stacked capacitor second electrode.

26. The method of claim 1, wherein the first and second electrically conductive layers comprise aluminum, doped polysilicon, titanium nitride, or silicided polysilicon.

27. The method of claim 1, wherein the first and second electrically conductive layers comprise copper.

28. A method for forming an integrated circuit capacitor, comprising the steps of:

forming a primary electrically insulating layer over a substrate;

forming a first electrically conductive layer over the primary electrically insulating layer;

patterning the first electrically conductive layer, thereby defining a capacitor region comprising one or more secondary enlarged via regions which are defined therein;

forming a first electrically insulating layer over the first electrically conductive layer and primary electrically insulating layer;

patterning the first electrically insulating layer, thereby defining a standard via and a primary enlarged via therein, whereby patterning the first electrically insulating layer also comprises using the first electrically conductive layer as a mask for patterning the primary electrically insulating layer within the primary enlarged via, thereby defining one or more secondary enlarged vias corresponding to the one or more secondary enlarged via regions therein;

forming an electrically conductive first electrode layer over the first electrically insulating layer, the first electrically conductive layer, the primary insulating layer, and the substrate, thereby filling the standard via and overlying the primary and secondary enlarged vias in a generally conformal manner;

forming a dielectric layer over the first electrode layer;

forming an electrically conductive second electrode layer over the dielectric layer; and planarizing the second electrode layer, the dielectric layer, and the first electrode layer a predetermined amount, thereby defining and laterally electrically isolating a capacitor in the capacitor region.

29. The method of claim 28, wherein the first electrically conductive layer comprises a wiring layer.

30. The method of claim 28, wherein the first electrode layer comprises one or more electrically conductive first electrode sublayers.

31. The method of claim 30, wherein one of the electrically conductive first electrode sublayers comprises a barrier metal.

32. The method of claim 31, wherein the barrier metal comprises titanium nitride.

33. The method of claim 30, wherein one of the electrically conductive first electrode sublayers comprises a plug metal.

34. The method of claim 33, wherein the plug metal comprises tungsten.

35. The method of claim 28, wherein the second electrode layer comprises one or more electrically conductive second electrode sublayers.

36. The method of claim 35, wherein one of the electrically conductive second electrode sublayers comprises a plug metal.

37. The method of claim 36, wherein the plug metal comprises tungsten.

38. The method of claim 35, wherein one of the electrically conductive second electrode sublayers comprises a protective metal which protects the dielectric layer during planarization.

39. The method of claim 38, wherein the protective metal comprises a material selected from the group consisting of titanium, titanium-tungsten, and titanium nitride.

40. The method of claim 28, wherein the dielectric layer comprises a material selected from the group consisting of silicon oxide, silicon nitride, silicon oxynitride, tantalum pentoxide, titanium oxide, barium strontium titanate (BST), and aluminum oxide.

41. The method of claim 28, wherein planarizing the second electrode layer, the dielectric layer, and the first electrode layer is performed using a chemical mechanical polishing technique.

42. The method of claim 28, wherein planarizing the second electrode layer, the dielectric layer, and the first electrode layer a predetermined amount is performed at least until the first electrically insulating layer is reached.

43. The method of claim 28, further comprising the steps of:

forming a second electrically conductive layer over the planarized first electrode layer, the dielectric layer, and the second electrode layer; and patterning the second electrically conductive layer, thereby forming an electrical connection to the capacitor, to which other components may be connected.

44. The method of claim 43, wherein the second electrically conductive layer comprises a wiring layer.

45. The method of claim 43, further comprising forming and defining a stacked capacitor comprising the steps of:

defining the formed capacitor as a first capacitor;

forming a second electrically conductive layer over the planarized first capacitor second electrode layer;

patterning the second electrically conductive layer, thereby defining a first capacitor second electrode connector;

forming a second capacitor over the first capacitor second electrode connector such that a first electrode of the second capacitor electrically connects to the second electrode connector of the first capacitor, thus defining a stacked capacitor first electrode, and wherein the second capacitor comprises a planarized second electrode layer;

forming a third electrically conductive layer over the planarized second capacitor second electrode layer;

patterning the third electrically conductive layer, thereby defining a second capacitor second electrode connector; and electrically connecting the first capacitor first electrode to the second capacitor second electrode, thereby defining a stacked capacitor second electrode.

46. The method of claim 28, wherein the first and second electrically conductive layers comprise aluminum, doped polysilicon, titanium nitride, or silicided polysilicon.

47. The method of claim 28, wherein the first and second electrically conductive layers comprise copper.

48. A method for forming an integrated circuit capacitor, comprising the steps of:

forming a primary electrically insulating layer over a substrate;

forming a first electrically conductive layer over the primary electrically insulating layer;

patterning the first electrically conductive layer, thereby defining a capacitor region;

forming a first electrically insulating layer over the first electrically conductive layer;

patterning the first electrically insulating layer and the primary electrically insulating layer, thereby defining a standard via, a primary enlarged via, and one or more secondary enlarged vias therein, whereby the primary enlarged via is defined by using the first electrically conductive layer as an etch stop, and the one or more secondary enlarged vias are defined by using the substrate as an etch stop;

forming an electrically conductive first electrode layer over the first electrically insulating layer, the first electrically conductive layer, the primary electrically insulating layer, and the substrate, thereby filling the standard via and overlying the primary enlarged via and the one or more secondary enlarged vias in a generally conformal manner;

forming a dielectric layer over the first electrode layer;

forming an electrically conductive second electrode layer over the dielectric layer; and planarizing the second electrode layer, the dielectric layer, and the first electrode layer a predetermined amount, thereby defining and laterally electrically isolating a capacitor in the capacitor region.

49. The method of claim 48, wherein the first electrode layer makes electrical contact to the first electrically conductive layer at a plurality of points in the capacitor region.

50. The method of claim 48, wherein the first electrically conductive layer comprises a wiring layer.

51. The method of claim 48, wherein the first electrode layer comprises one or more electrically conductive first electrode sublayers.

52. The method of claim 51, wherein one of the electrically conductive first electrode sublayers comprises a barrier metal.

53. The method of claim 52, wherein the barrier metal comprises titanium nitride.

54. The method of claim 51, wherein one of the electrically conductive first electrode sublayers comprises a plug metal.

55. The method of claim 54, wherein the plug metal comprises tungsten.

56. The method of claim 48, wherein the second electrode layer comprises one or more electrically conductive second electrode sublayers.

57. The method of claim 56, wherein one of the electrically conductive second electrode sublayers comprises a plug metal.

58. The method of claim 57, wherein the plug metal comprises tungsten.

59. The method of claim 56, wherein one of the electrically conductive second electrode sublayers comprises a protective metal which protects the dielectric layer during planarization.

60. The method of claim 59, wherein the protective metal comprises a material selected from the group consisting of titanium, titanium-tungsten, and titanium nitride.

61. The method of claim 48, wherein the dielectric layer comprises a material selected from the group consisting of silicon oxide, silicon nitride, silicon oxynitride, tantalum pentoxide, titanium oxide, barium strontium titanate (BST), and aluminum oxide.

62. The method of claim 48, wherein planarizing the second electrode layer, the dielectric layer, and the first electrode layer is performed using a chemical mechanical polishing technique.

63. The method of claim 48, wherein planarizing the second electrode layer, the dielectric layer, and the first electrode layer a predetermined amount is performed at least until the first electrically insulating layer is reached.

64. The method of claim 48, further comprising the steps of:
    forming a second electrically conductive layer over the planarized first electrode layer, the dielectric layer, and the second electrode layer; and
    patterning the second electrically conductive layer, thereby forming an electrical connection to the capacitor, to which other components may be connected.

65. The method of claim 64, wherein the second electrically conductive layer comprises a wiring layer.

66. The method of claim 64, further comprising forming and defining a stacked capacitor comprising the steps of:
    defining the formed capacitor as a first capacitor;
    forming a second electrically conductive layer over the planarized first capacitor second electrode layer;
    patterning the second electrically conductive layer, thereby defining a first capacitor second electrode connector;
    forming a second capacitor over the first capacitor second electrode connector such that a first electrode of the second capacitor electrically connects to the second electrode connector of the first capacitor, thus defining a stacked capacitor first electrode, and wherein the second capacitor comprises a planarized second electrode layer;
    forming a third electrically conductive layer over the planarized second capacitor second electrode layer;
    patterning the third electrically conductive layer, thereby defining a second capacitor second electrode connector; and
    electrically connecting the first capacitor first electrode to the second capacitor second electrode, thereby defining a stacked capacitor second electrode.

67. The method of claim 48, wherein the first and second electrically conductive layers comprise aluminum, doped polysilicon, titanium nitride, or silicided polysilicon.

68. The method of claim 48, wherein the first and second electrically conductive layers comprise copper.

* * * * *